(12) United States Patent
Tahmassebpur

(10) Patent No.: US 10,388,489 B2
(45) Date of Patent: Aug. 20, 2019

(54) ELECTRON SOURCE ARCHITECTURE FOR A SCANNING ELECTRON MICROSCOPY SYSTEM

(71) Applicant: KLA-Tencor Corporation, Milpitas, CA (US)

(72) Inventor: Mohammed Tahmassebpur, San Ramon, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/887,861

(22) Filed: Feb. 2, 2018

(65) Prior Publication Data

US 2018/0240640 A1    Aug. 23, 2018

Related U.S. Application Data

(60) Provisional application No. 62/455,961, filed on Feb. 7, 2017.

(51) Int. Cl.
*H01J 37/06* (2006.01)
*H01J 37/063* (2006.01)
(Continued)

(52) U.S. Cl.
CPC .......... *H01J 37/063* (2013.01); *H01J 37/065* (2013.01); *H01J 37/073* (2013.01); *H01J 37/09* (2013.01);
(Continued)

(58) Field of Classification Search
CPC ........ H01J 37/06; H01J 37/063; H01J 37/065; H01J 37/09; H01J 37/147; H01J 37/1471;
(Continued)

(56) References Cited

U.S. PATENT DOCUMENTS 5,145,438 A    9/1992  Bol
5,363,021 A *  11/1994 MacDonald ............ H01J 3/022
                                                250/396 R
(Continued)

FOREIGN PATENT DOCUMENTS

EP    1141995 A1    10/2001
EP    1145272 A3    11/2002
(Continued)

OTHER PUBLICATIONS

Chang, T.H.P. et al., "Multiple electron-beam lithography", Elsevier, Microelectronic Engineering, 57-58 2001, pp. 117-135.
(Continued)

*Primary Examiner* — David E Smith
(74) *Attorney, Agent, or Firm* — Suiter Swantz pc llo

(57) ABSTRACT

A scanning electron microscopy (SEM) system includes a plurality of electron-optical columns and a plurality of electron beam sources. The electron beam sources include an emitter including one or more emitter tips configured to generate one or more electron beams of a plurality of electron beams. The electron beam sources include a stack of one or more positioners configured to adjust a position of the emitter based on one or more measurements of the electron beam generated by the emitter. The emitter is configured to scan the one or more electron beams across an area surrounding a bore of an electron-optical column of the plurality of electron-optical columns. The electron beam source array includes a carrier plate and a source tower. The source tower is configured to adjust a position of the plurality of electron beam sources relative to a position of the plurality of electron-optical columns.

35 Claims, 14 Drawing Sheets

(51) Int. Cl.
*H01J 37/065* (2006.01)
*H01J 37/244* (2006.01)
*H01J 37/28* (2006.01)
*H01J 37/147* (2006.01)
*H01J 37/09* (2006.01)
*H01J 37/073* (2006.01)
*H01J 37/317* (2006.01)
*H01J 37/067* (2006.01)
*H01J 37/26* (2006.01)
*H01J 37/30* (2006.01)

(52) U.S. Cl.
CPC ........ *H01J 37/1471* (2013.01); *H01J 37/244* (2013.01); *H01J 37/28* (2013.01); *H01J 37/3177* (2013.01); *H01J 37/067* (2013.01); *H01J 37/261* (2013.01); *H01J 37/3007* (2013.01); *H01J 2237/024* (2013.01); *H01J 2237/061* (2013.01); *H01J 2237/0635* (2013.01)

(58) Field of Classification Search
CPC .......... H01J 37/244; H01J 37/26; H01J 37/28; H01J 37/073; H01J 37/261; H01J 37/3007; H01J 37/3177; H01J 2237/024; H01J 2237/061; H01J 2237/0635; G01N 23/225
See application file for complete search history.

(56) References Cited

U.S. PATENT DOCUMENTS

| | | |
|---|---|---|
| 6,281,508 B1 | 8/2001 | Lee et al. |
| 6,617,587 B2 | 9/2003 | Parker et al. |
| 6,724,002 B2 | 4/2004 | Mankos et al. |
| 6,797,953 B2 | 9/2004 | Gerlach et al. |
| 6,844,550 B1 | 1/2005 | Yin et al. |
| 7,067,089 B2 * | 6/2006 | Wen .......... A23L 3/28 422/28 |
| 7,067,809 B2 | 6/2006 | Lo et al. |
| 7,262,418 B2 | 8/2007 | Lo et al. |
| 9,153,413 B2 * | 10/2015 | Almogy .......... H01J 37/05 |
| 9,207,539 B1 | 12/2015 | Lam et al. |
| 9,431,209 B2 | 8/2016 | Ren et al. |
| 9,466,462 B2 | 10/2016 | Sender et al. |
| 2002/0117967 A1 * | 8/2002 | Gerlach .......... B82Y 10/00 315/13.1 |
| 2004/0036398 A1 * | 2/2004 | Jin .......... B82Y 10/00 313/309 |
| 2006/0289752 A1 | 12/2006 | Fukunishi et al. |
| 2012/0241606 A1 | 9/2012 | Han et al. |
| 2013/0248733 A1 | 9/2013 | Nomaguchi et al. |
| 2014/0117231 A1 | 5/2014 | Owen et al. |
| 2014/0299768 A1 | 10/2014 | Shichi et al. |
| 2015/0060662 A1 * | 3/2015 | Chen .......... H01J 37/145 250/307 |
| 2015/0155134 A1 | 6/2015 | Frosien et al. |
| 2015/0371810 A1 * | 12/2015 | Guerrera .......... H01J 37/065 250/396 R |
| 2016/0064180 A1 * | 3/2016 | Ren .......... H01J 37/141 250/307 |
| 2018/0218874 A1 * | 8/2018 | Cho .......... H01J 37/06 |

FOREIGN PATENT DOCUMENTS

| | | |
|---|---|---|
| EP | 2879155 A1 | 6/2015 |
| KR | 20080057597 A | 6/2008 |
| WO | 0135440 A1 | 5/2001 |
| WO | 2005112043 A1 | 11/2005 |

OTHER PUBLICATIONS

Lapedus, Mark, "Wanted: Multi-Beam E-Beam Inspection", Semiconductor Engineering, Sep. 18, 2014, pp. 1/5, http://semiengineering.com/wanted-multi-beam-e-beam-inspection/.

Mccord, Mark A. et al., "E Beam Lithography", SPIE Handbook of Microlithography, Micromachining and Microfabrication, vol. 1 Microlithography, Chapter 2, pp. 1-75.

Mccord, M. A. et al., "Lithography with the scanning tunneling microscope", Journal of Vacuum Science & Technology, B. Microelectronics and Nanometer Structures: Processing, Measurement, and Phenomena: an official Journal of the American Vacuum Society 4(1):86-88, Feb. 1986 (Abstract).

Okazaki, Shinji, "Recent development activities on Maskless Lithography in Japan", Asscociation of Super-Advanced Electronics Technologies, Advantest, e-Beam Corporation, Hitachi High-Technologies Corporation, A Set, 28 pages.

Param Corporation, Multi-beam multi-column system, description of "Multi Axis PSB", http://www.param.co.jp/en/contents/lithography/multi-beam/, Feb. 17, 2017, pp. 1-6.

International Search Report dated May 18, 2018 for PCT/US2018/016902.

* cited by examiner

ELECTRON SOURCE ARCHITECTURE FOR A SCANNING ELECTRON MICROSCOPY SYSTEM

CROSS-REFERENCE TO RELATED APPLICATIONS

The present application claims the benefit under 35 U.S.C. § 119(e) of U.S. Provisional Patent Application Ser. No. 62/455,961, filed Feb. 7, 2017, entitled ELECTRON SOURCE ARCHITECTURE FOR A MULTI-EMITTER MULTI-COLUMN ELECTRON OPTICS, naming Mohammed Tahmassebpur as inventors, which is incorporated herein by reference in the entirety.

TECHNICAL FIELD

The present invention generally relates to wafer and photomask/reticle characterization and fabrication and, more particularly, to an electron source architecture for a scanning electron microscopy system.

BACKGROUND

The fabrication of semiconductor devices, such as logic and memory devices, typically includes processing a semiconductor device using a large number of semiconductor fabrication and metrology processes to form various features and multiple layers of the semiconductor devices. Select fabrication processes utilize photomasks/reticles to print features on a semiconductor device such as a wafer. As semiconductor devices become smaller and smaller laterally and extended vertically, it becomes critical to develop enhanced inspection and review devices and procedures to increase sensitivity and throughput of photomask, reticle, and wafer inspection processes.

One inspection technology includes electron beam-based inspection such as scanning electron microscopy (SEM). In some instances, scanning electron microscopy is performed via secondary electron beam collection (e.g., a secondary electron (SE) imaging system). In other instances, scanning electron microscopy is performed by splitting a single electron beam into numerous beams and utilizing a single electron-optical column to individually tune and scan the numerous beams (e.g., a multi-beam SEM system). In other instances, scanning electron microscopy is performed via an SEM system which includes an increased number of electron-optical columns (e.g., a multi-column SEM system).

SEM systems include electron beam sources that generate electron beams utilized to characterize a photomask/reticle or wafer. Traditionally, the electron beam sources each include an electron emitter with an emitter tip. When an emitter tip burns out, all electron beam sources must be removed from the SEM system. Where the electron beam sources are coupled together in a single assembly, the ultra-high vacuum (UHV) environment in which the SEM system operates must be broken so the burnt-out tip may be replaced. Repairing the burnt-out electron beam source, reinstalling the electron beam source, and restoring the UHV environment may result in a downtime measured in weeks and repair costs measured in the tens of thousands of dollars.

The electron beams generated by the electron beam sources are extremely sensitive to misalignment, to the order of microns, such that misalignment may occur from improper installation of the electron beam sources, system jitter, emitter tip expansion when heated, or the like. To correct for the misalignment, each electron emitter of an electron beam source is coupled to a stack of positioners. The stack of positioners is manually adjusted from the atmospheric side of the UHV to prevent the breaking of the UHV. The manual adjustment is monitored via visual or emission feedback and can be lengthy in time and/or tedious in nature. In addition, the manual alignment is completed on a per-emitter basis, and does not allow for the simultaneous alignment of multiple emitters. Further, the manual alignment when the SEM system is not operational may be negated at least in part by the expansion of a heated emitter tip when the SEM system is operational. This, combined with the sensitivity of the stack of positioners to the heat generated by the emitter tip during operation, causes considerable difficulty with aligning the electron beams.

Therefore, it would be advantageous to provide a system and method that cures the shortcomings described above.

SUMMARY

A scanning electron microscopy (SEM) system is disclosed, in accordance with one or more embodiments of the present disclosure. In one embodiment, the SEM system includes an electron-optical column array. In another embodiment, the electron-optical column array includes a plurality of electron-optical columns. In another embodiment, the SEM system includes an electron beam source array couplable to the electron-optical column array. In another embodiment, the electron beam source array includes a plurality of electron beam sources configured to generate a plurality of electron beams. In another embodiment, at least some of the electron beam sources include an emitter coupled to an emitter holder. In another embodiment, the emitter includes one or more emitter tips configured to generate one or more electron beams of the plurality of electron beams. In another embodiment, the at least some of the electron beam sources include a stack of one or more positioners coupled to the emitter holder. In another embodiment, the stack of one or more positioners is configured to adjust a position of the emitter based on one or more measurements of the electron beam generated by the emitter. In another embodiment, the emitter is configured to scan the one or more electron beams across an area surrounding a bore of a particular electron-optical column of the plurality of electron-optical columns. In another embodiment, the electron beam source array includes a carrier plate coupled to the plurality of electron beam sources. In another embodiment, the electron beam source array includes a source tower coupled to the carrier plate. In another embodiment, the source tower is configured to adjust a position of the plurality of electron beam sources relative to a position of the plurality of electron-optical columns.

A scanning electron microscopy (SEM) system is disclosed, in accordance with one or more embodiments of the present disclosure. In one embodiment, the SEM system includes an electron-optical column array. In another embodiment, the electron-optical column array includes a plurality of electron-optical columns. In another embodiment, the SEM system includes an electron beam source array couplable to the electron-optical column array. In another embodiment, the electron beam source array includes a plurality of electron beam sources configured to generate a plurality of electron beams. In another embodiment, at least some of the electron beam sources include an emitter coupled to an emitter holder. In another embodiment, the emitter includes one or more emitters tips configured to generate one or more electron beams of the plurality of electron beams. In another embodiment the at least some of the electron beam sources include a stack of one or more actuators coupled to the emitter holder. In another embodiment, the stack of one or more actuators is configured to adjust a position of the emitter. In another embodiment, the at least some of the electron beam sources include a thermal bypass. In another embodiment, the thermal bypass is positioned between the emitter holder and the stack of one or more actuators. In another embodiment, the thermal bypass is positioned between the stack of one or more actuators and the carrier plate. In another embodiment, the thermal bypass is configured to transfer heat from the emitter holder to the carrier plate A scanning electron microscopy (SEM) system is disclosed, in accordance with one or more embodiments of the present disclosure. In one embodiment, the SEM system includes an electron-optical column array. In another embodiment, the electron-optical column array includes a plurality of electron-optical columns. In another embodiment, the SEM system includes an electron beam source array couplable to the electron-optical column array. In another embodiment, the electron beam source array includes a plurality of electron beam sources configured to generate a plurality of electron beams. In another embodiment, at least some of the electron beam sources include an emitter. In another embodiment, the emitter includes a first emitter tip configured to generate a first electron beam of the plurality of electron beams and a second emitter tip configured to generate a second electron beam of the plurality of electron beams. In another embodiment, the second emitter tip is configured to receive a selected amount of electric current when the first emitter tip fails.

A method is disclosed, in accordance with one or more embodiments of the present disclosure. In one embodiment, the method may include, but is not limited to, scanning an area surrounding a bore of an electron-optical element of an electron-optical column for an electric current generated by an electron beam directed at the bore. In another embodiment, the electron-optical column is a component of an electron-optical column array. In another embodiment, the method may include, but is not limited to, determining coarse adjustment data based on the scanned electric current. In another embodiment, the method may include, but is not limited to, providing the coarse adjustment data to adjust a source tower of an electron beam source array via one or more coarse alignment processes. In another embodiment, the method may include, but is not limited to, determining fine adjustment data based on the scanned electric current. In another embodiment, the method may include, but is not limited to, providing the fine adjustment data to adjust one or more positioners coupled to an electron beam source of the electron beam source array via one or more fine alignment processes. In another embodiment, at least one of the electron-optical column array or the electron beam source array is a component of a scanning electron microscopy (SEM) system.

A method is disclosed, in accordance with one or more embodiments of the present disclosure. In one embodiment, the method may include, but is not limited to, dismounting an electron beam source array from an electron-optical column array. In another embodiment, the electron beam source array includes a plurality of electron beam sources. In another embodiment, the plurality of electron beam sources generates a plurality of electron beams. In another embodiment, the method may include, but is not limited to, aligning a first electron beam source of the plurality of electron beam sources with a viewport of a test chamber. In another embodiment, the first electron beam source generates a first electron beam of the plurality of electron beams. In another embodiment, the method may include, but is not limited to, performing one or more inspection processes on the first electron beam of the plurality of electron beams. In another embodiment, the method may include, but is not limited to, repositioning the first electron beam source within the electron beam source array. In another embodiment, the method may include, but is not limited to, aligning at least an additional electron beam source of the electron beam source array with the viewport of the test chamber. In another embodiment, the at least the additional electron beam source generates at least an additional electron beam of the plurality of electron beams. In another embodiment, the method may include, but is not limited to, performing one or more inspection processes on the at least the additional electron beam of the plurality of electron beams. In another embodiment, the method may include, but is not limited to, repositioning the at least the additional electron beam source within the electron beam source array. In another embodiment, the method may include, but is not limited to, remounting the electron beam source array onto the electron-optical column array. In another embodiment, at least one of the electron beam source array, the electron-optical column array, or the test chamber is a component of a scanning electron microscopy (SEM) system.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Reference will now be made in detail to the subject matter disclosed, which is illustrated in the accompanying drawings.

Referring generally to FIGS. 1A-4B, an electron source architecture for a scanning electron microscopy (SEM) system is disclosed, in accordance with one or more embodiments of the present disclosure.

Embodiments of the present disclosure are directed to a multi-emitter, multi-column scanning electron microscopy (SEM) tool. Embodiments of the present disclosure are also directed to wafer inspection or lithography via high brightness emission for electron-optical columns in the multi-column SEM tool. Embodiments of the present disclosure are also directed to automated alignment of an electron beam through a column aperture or extractor bore of an electron-optical column. Embodiments of the present disclosure are also directed to in-situ visual, thermal, and/or vibration inspection of individual or group electron beam sources within an electron beam source array. Embodiments of the present disclosure are also directed to in-situ calibration of individual or group electron beam sources within an electron beam source array.

FIGS. 1A-1F generally illustrate a scanning electron microscopy (SEM) review tool 100, in accordance with one or more embodiments of the present disclosure. It is noted herein that "SEM system" and "SEM review tool" may be considered synonymous for purposes of the present disclosure.

Figure 1A:
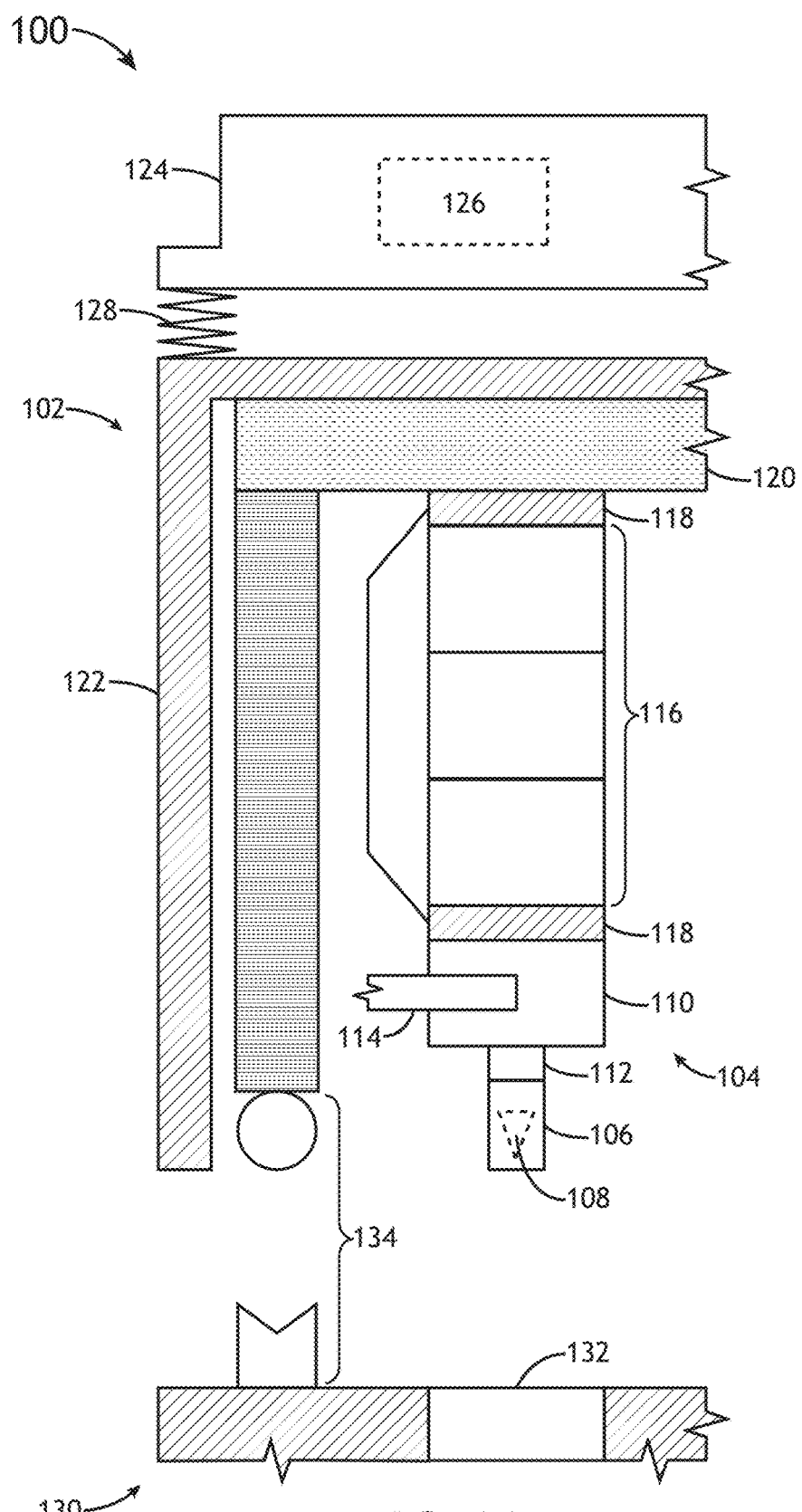
FIG. 1A illustrates a simplified block diagram of a scanning electron microscopy (SEM) review tool including an electron beam source assembly, in accordance with one or more embodiments of the present disclosure.
Figure 1B:
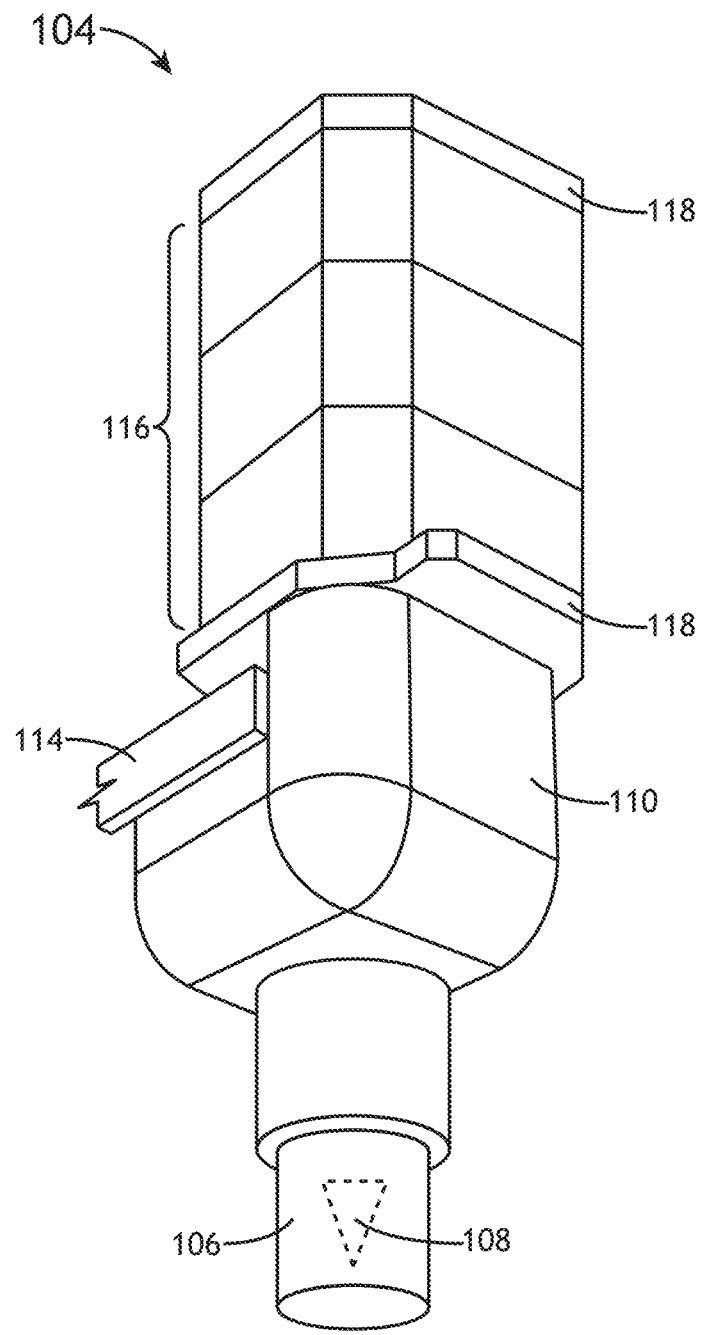
FIG. 1B illustrates a simplified schematic view of an electron beam source for an SEM review tool, in accordance with one or more embodiments of the present disclosure.

FIG. 1A illustrates a simplified block diagram of the SEM review tool 100, in accordance with one or more embodiments of the present disclosure. FIG. 1B illustrates a simplified schematic view of an electron beam source 104 of the SEM review tool 100, in accordance with one or more embodiments of the present disclosure.

In one embodiment, the SEM review tool 100 includes an electron beam source array 102. In another embodiment, the electron beam source array 102 includes one or more electron beam sources 104. In another embodiment, each electron beam source 104 includes an electron beam emitter 106. For example, the electron beam emitter 106 may include, but is not limited to, a Schottky emitter device, a carbon nanotube (CNT) emitter, a nanostructured carbon film emitter, a Muller-type emitter, or the like. In another embodiment, each electron beam emitter 106 includes one or more emitter tips 108. For example, the electron beam emitter 106 may include a single emitter tip 108. By way of another example, the electron beam emitter 106 may include two emitter tips 108. By way of another example, the electron beam emitter 106 may include three or more emitter tips 108. It is noted herein a particular electron beam emitter 106 may include any number of emitter tips 108 that may fit within the space dictated by the design of the electron beam emitter 106.

In another embodiment, the electron beam emitter 106 is coupled to an emitter holder 110. For example, the electron beam emitter 106 may be coupled to the emitter holder 110 via one or more clamp assemblies 112. For instance, the one or more clamp assemblies 112 may include, but are not limited to, one or more standard clamp assemblies, one or more brazed clamp assemblies, or the like. In another embodiment, the emitter holder 110 includes a high-voltage terminal 114. For example, the high-voltage terminal 114 may be coupled to one or more high-voltage wires. For instance, the high-voltage terminal 114 may be coupled to three high-voltage wires.

In another embodiment, the electron beam emitter 106 is coupled to the one or more high-voltage wires. For example, where there are two emitter tips 108 within the electron beam emitter 106, each emitter tip 108 may be coupled to the one or more high-voltage wires. In this example, either one or both emitter tips 108 may be supplied with a current. For instance, the current may be supplied to a first emitter tip 108 of the two emitter tips, and then to a second emitter tip 108 of the two emitter tips 108 after the first emitter tip 108 is non-operational (e.g., burns out). When the current is supplied to the second emitter tip 108, the electron beam source 104 may be adjusted to align the second emitter tip 108. In this regard, the electron beam source 104 may include a redundant emitter tip 108 arrangement, which may extend the life of the electron beam source array 102. In addition, the emitter 106 driving voltages and currents may be independently set and/or calibrated due to the separate voltage pathways.

In another embodiment, the emitter holder 110 is coupled to a stack of one or more positioners 116. In another embodiment, the stack of one or more positioners 116 is configured to actuate the emitter holder 110 (and the electron beam emitter 106) in one or more directions. For example, the stack of one or more positioners 116 may translate the emitter holder 110 (and the electron beam emitter 106) in one or more of an x-direction, a y-direction, or a z-direction (e.g., along an x-axis, a y-axis, and/or a z-axis). By way of another example, the stack of one or more positioners 116 may rotate the emitter holder 110 (and the electron beam emitter 106) in a rotational direction around an axis (e.g., a rotational direction around an x-axis, a y-axis, and/or a z-axis). In another embodiment, the stack of one or more positioners 116 is configured to move the emitter holder 110 (and the electron beam emitter 106) independently to the required target position from other stacks of one or more positioners 116 within the electron beam source array 102. It is noted herein, however, that a stack of one or more positioners 116 may be configured to actuate multiple electron beam sources 104 of the electron beam source array 102 either as a partial unit grouping together at least some of the multiple electron beam sources 104 or as a complete unit grouping together all of the multiple electron beam sources 104. Therefore, the above description should not be interpreted as a limitation on the scope of the present disclosure but merely an illustration.

In another embodiment, the stack of one or more positioners 116 is configured to operate in an ultra-high vacuum (UHV) environment. In another embodiment, the stack of one or more positioners 116 is configured to provide feedback. For example, the feedback may be generated via resistive and/or capacitive encoders positioned within the UHV environment. By way of another example, the feedback may be optical (e.g., via a viewport or via an optical interferometer).

In another embodiment, a heated emitter tip 108 generates heat, operating at a selected temperature (e.g., the heated emitter tip 108 may operate at approximately 1800K). In another embodiment, the stack of one or more positioners 116 is sensitive to the generated heat. For example, the excess heat may damage the stack of one or more positioners 116, rendering them unusable. In another embodiment, the electron beam source 104 includes one or more thermal bypasses 118. For example, the one or more thermal bypasses 118 are positioned between the emitter holder 110 and the stack of one or more positioners 116. In this regard, the one or more thermal bypasses 118 transfer heat away from the stack of one or more positioners 116, such that heat generated by a heated emitter tip 108 may not interfere and/or otherwise damage the stack of one or more positioners 116.

In another embodiment, the electron beam source array 102 includes a carrier plate 120. In another embodiment, the stack of one or more positioners 116 is coupled to the carrier plate 120. In another embodiment, the electron beam source array 102 includes a magnetic shield 122. For example, the magnetic shield 122 may be a component of the electron beam source array 102 surrounding the electron beam sources 104. By way of another example, the magnetic shield 122 may be built within each electron beam source 104.

In another embodiment, the electron beam source array 102 includes a source tower 124. In another embodiment, the source tower 124 provides position adjustment to the electron beam sources 104 via one or more xyz-manipulators, or actuators, 126. For example, the one or more actuators 126 may translate the electron beam sources 104 in one or more of an x-direction, a y-direction, or a z-direction (e.g., along an x-axis, a y-axis, and/or a z-axis). For instance, the one or more actuators 126 may re-position (e.g., raise or lower) the electron beam sources 104 during inspection, adjustment, and/or calibration of the electron beam sources 104. By way of another example, the one or more actuators 126 may rotate the electron beam sources 104 (and thus the electron beam emitter 106) in a rotational direction around an axis (e.g., a rotational direction around an x-axis, a y-axis, and/or a z-axis).

In another embodiment, where the magnetic shield 122 is a component of the electron beam source array 102 surrounding the electron beam sources 104, the source tower 124 is coupled to the magnetic shield 122 via a flexible joint 128. For example, the flexible joint 128 may provide a pressure force between the magnetic shield 122 and the source tower 124. By way of another example, the flexible joint 128 may include, but is not limited to, a spring.

Although embodiments of the present disclosure are directed to the SEM review tool 100 including primary adjustment capabilities via the stack of one or more positioners 116 and secondary adjustment capabilities via the one or more actuators 126, it is noted herein the SEM review tool 100 may only include the primary adjustment capabilities via the stack of one or more positioners 116. Therefore, the above description should not be interpreted as a limitation on the scope of the present disclosure but merely an illustration.

In another embodiment, the one or more thermal bypasses 118 transfer heat from the emitter holder 110 to the carrier plate 120. In another embodiment, the one or more thermal bypasses 118 transfer heat from the emitter holder 110 to the magnetic shield 122. In another embodiment, the one or more thermal bypasses 118 transfer heat from the emitter holder 110 to the source tower 124. In this regard, heat may be transferred around the stack of one or more positioners 116, effectively bypassing the stack of one or more positioners 116.

Figure 1C:
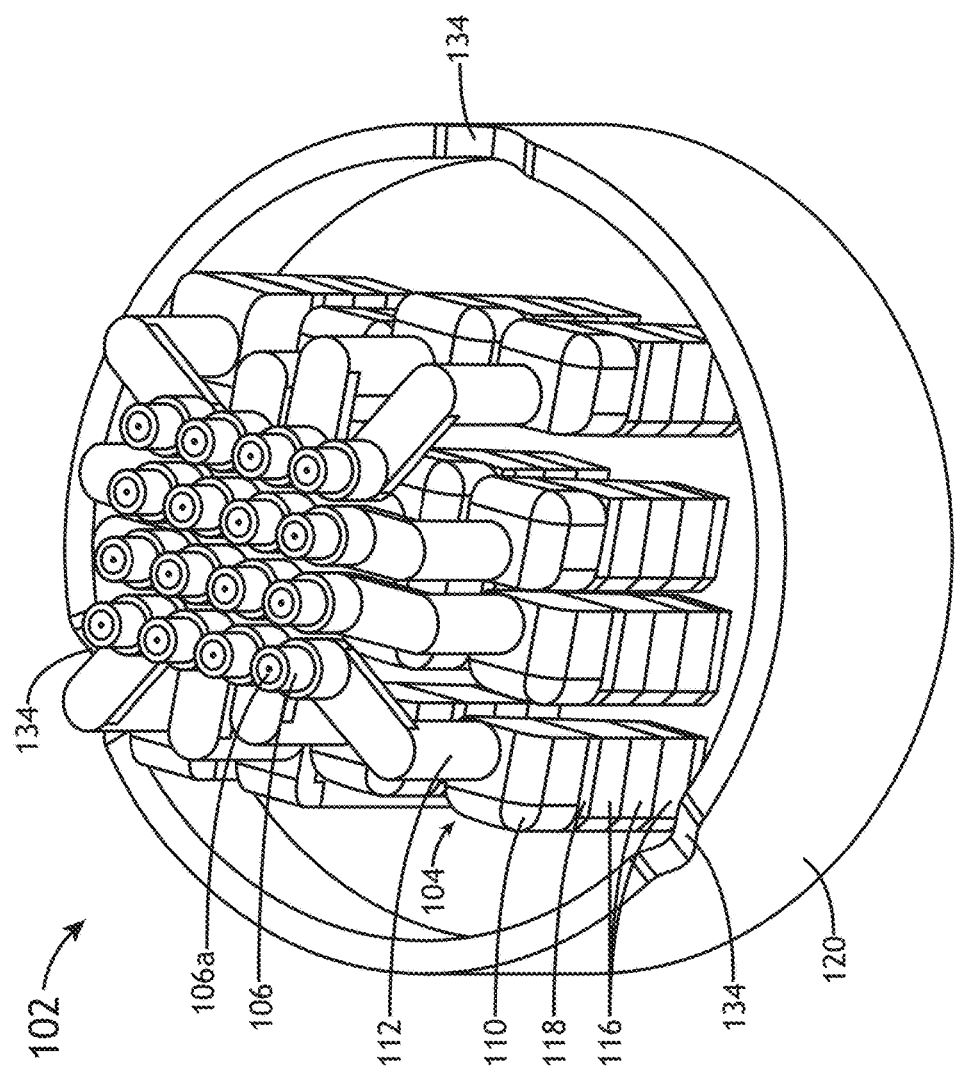
FIG. 1C illustrates a simplified schematic view of an electron beam source array for an SEM review tool, in accordance with one or more embodiments of the present disclosure.
Figure 1D:
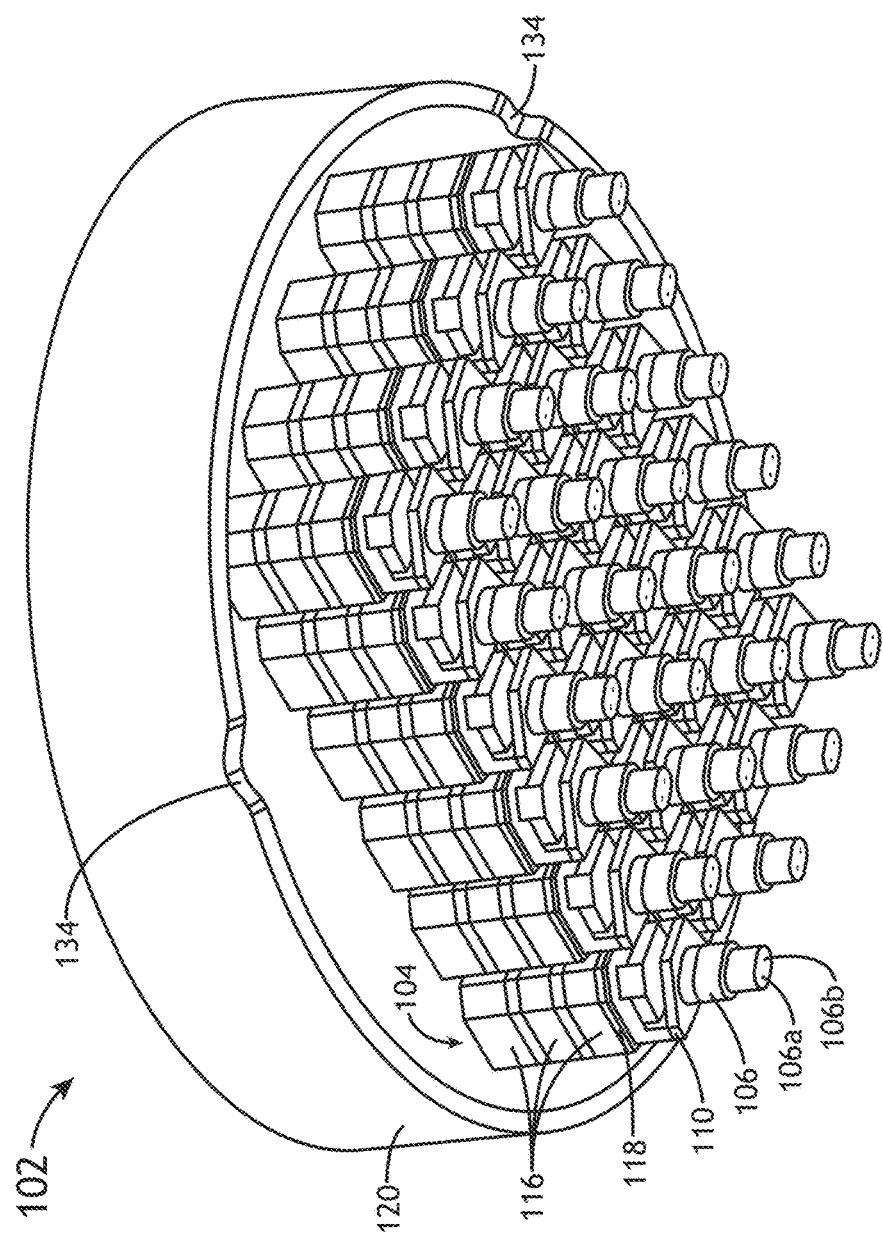
FIG. 1D illustrates a simplified schematic view of an electron beam source array for an SEM review tool, in accordance with one or more embodiments of the present disclosure.

FIGS. 1C and 1D generally illustrate a simplified schematic view of an electron beam source array 102, in accordance with one or more embodiments of the present disclosure.

In one embodiment, the electron beam source array 102 includes one or more electron beam sources 104. For example, as illustrated in FIG. 1C, the electron beam source array 102 may include, but is not limited to, sixteen electron beam sources 104 arranged in a 4×4 array. By way of another example, the electron beam source array 102 may include, but is not limited to, twenty-four electron beam sources 104 arranged in a 6×4 array. In another embodiment, each electron beam source 104 of the electron beam source array 102 includes one or more emitter holes. For example, as illustrated in FIG. 1C, the electron beam source 104 may include, but is not limited to, emitter hole 106a in the emitter 106 for a single emitter tip 108. By way of another example, as illustrated in FIG. 1D, the electron beam source 104 may include, but is not limited to, emitter holes 106a and 106b in the emitter 106 for two emitter tips 108.

In another embodiment, each of the one or more electron beam sources 104 in the electron beam source array 102 includes an emitter holder 110 coupled to the emitter 106. In another embodiment, each of the one or more electron beam sources 104 in the electron beam source array 102 includes a stack of one or more positioners 116 coupled to the emitter holder 110. In another embodiment, each of the one or more electron beam sources 104 in the electron beam source array 102 includes a thermal bypass 118 surrounding the stack of one or more positioners 116. In another embodiment, the electron beam source array 102 includes the carrier plate 120. In another embodiment, the carrier plate 120 includes one or more components of one or more kinematic mount assemblies 134.

Referring again to FIG. 1A, in one embodiment the electron beam source array 102 is mechanically aligned to an electron-optical column array 130 including one or more electron-optical columns 132 via the one or more kinematic mount assemblies 134, where the kinematic mount assemblies 134 allow for repeatable positioning of the electron beam source array 102 on the electron-optical column array 130. For example, one or more kinematic mount assemblies 134 may include a ball-and-groove assembly. By way of another example, the carrier plate 120 and the electron-optical column array 130 may be mechanically aligned via three kinematic mount assemblies 134. For instance, the three kinematic mount assemblies 134 may be arranged at 120-degree intervals around a substantially circular carrier plate 120. In another embodiment, the kinematic mount assemblies 134 include one or more safety switches, where the safety switches indicate misalignment and/or allow or prevent the operation of the electron beam source array 102. For example, the one or more safety switches may be electrical. For instance, each kinematic mount assembly 134 may include two electrical safety switches, where not completing the circuit in either or both of the two electrical safety switches prevents the electron beam source array 102 from operating.

In another embodiment, the source tower 124 is configured to adjust a position of the one or more electron beam sources 104 relative to a position of the one or more electron-optical columns 132 based on feedback from the one or more kinematic mount assemblies 134 along or around at least one of an x-axis, a y-axis, or a z-axis. In another embodiment, the source tower 124 is configured to adjust a position of the one or more electron beam sources 104 relative to a position of the one or more electron-optical columns 132 based on feedback from the one or more safety switches of the one or more kinematic mount assemblies 134 along or around at least one of an x-axis, a y-axis, or a z-axis.

In another embodiment, the SEM review tool 100 operates in an ultra-high vacuum (UHV) environment. In another embodiment, the electron beam source array 102 and/or the electron-optical column array 130 are constructed from components treated and/or designed for usage in a UHV environment. For example, one or more components of the electron beam source array 102 (e.g., the electron beam emitters 106) and/or the electron-optical column array 130 may include ports for the UHV environment. By way of another example, components are treated for usage in the UHV environment by being cleaned and baked, then installed in the SEM review tool 100, then baked again in the constructed form. For instance, the SEM review tool 100 may include soft wires, where the soft wires include silver conductors with a clean and baked polyamide thin coating. It is noted herein the soft wires are selected for the SEM review tool 100 so as to not damage the stack of one or more positioners 116.

In another embodiment, the SEM review tool 100 includes one or more components usable during operation in the UHV environment. For example, the SEM review tool 100 may include one or more sensors, wires, encoders, cables, or the like necessary to perform measurements and/or adjust components of the SEM review tool 100 while the SEM review tool 100 is in operation. By way of another example, where the electron beam source array 102 is a removable component (e.g., a field replacement unit) of the SEM review tool 100, the SEM review tool 100 may include a valve that seals the UHV environment, which allows for the removal of the electron beam source array 102 without breaking the UHV environment of the electron-optical column array 130. In this regard, the downtime and/or recalibration necessary when servicing or replacing the electron beam source array 102 is greatly reduced, as the UHV environment does not need to be broken and rebuilt for the entire SEM review tool 100.

Although embodiments of the present disclosure are directed to an electron beam source array 102 that is removeable from the electron-optical column array 130 via the one or more kinematic mount assemblies 134, it is noted herein the electron beam source array 102 may be permanently mounted to the electron-optical column array 130. In addition, although embodiments of the present disclosures are directed to an electron beam source array 102 including one or more electron beam sources 104 coupled to the electron-optical column array 130 including the one or more electron-optical columns 132, it is noted herein the SEM review tool 100 may include complete miniature assemblies with a single electron beam source 104 coupled to a single electron-optical column 132. Therefore, the above description should not be interpreted as a limitation on the scope of the present disclosure but merely an illustration.

In another embodiment, the one or more electron beam sources 104 include one or more source electron-optical elements. For example, the one or more source electron-optical elements may direct at least a portion of an electron beam generated by the electron beam emitter 106 of an electron beam source 104 to a particular electron-optical column 132 of an electron-optical column array 130.

It is noted herein that the SEM review tool 100 may include any or all components including, but not limited to, redundant emitter tips 108 in the emitters 106 of the electron beam sources 104; an automated system for adjustment of stacks of one or more positioners 116 for the electron beam sources 104; thermal bypasses 118 capping the stacks of one or more positioners 116; magnetic shields 122 surrounding the electron beam sources 104; kinematic mount assemblies 134 between the electron beam source array 102 and the electron-optical column array 130; and/or UHV-compliant fabrication components. In this regard, the SEM review tool 100 does not require any particular set of components as listed throughout the embodiments herein. Therefore, the above description should not be interpreted as a limitation on the scope of the present disclosure but merely an illustration.

Figure 1E:
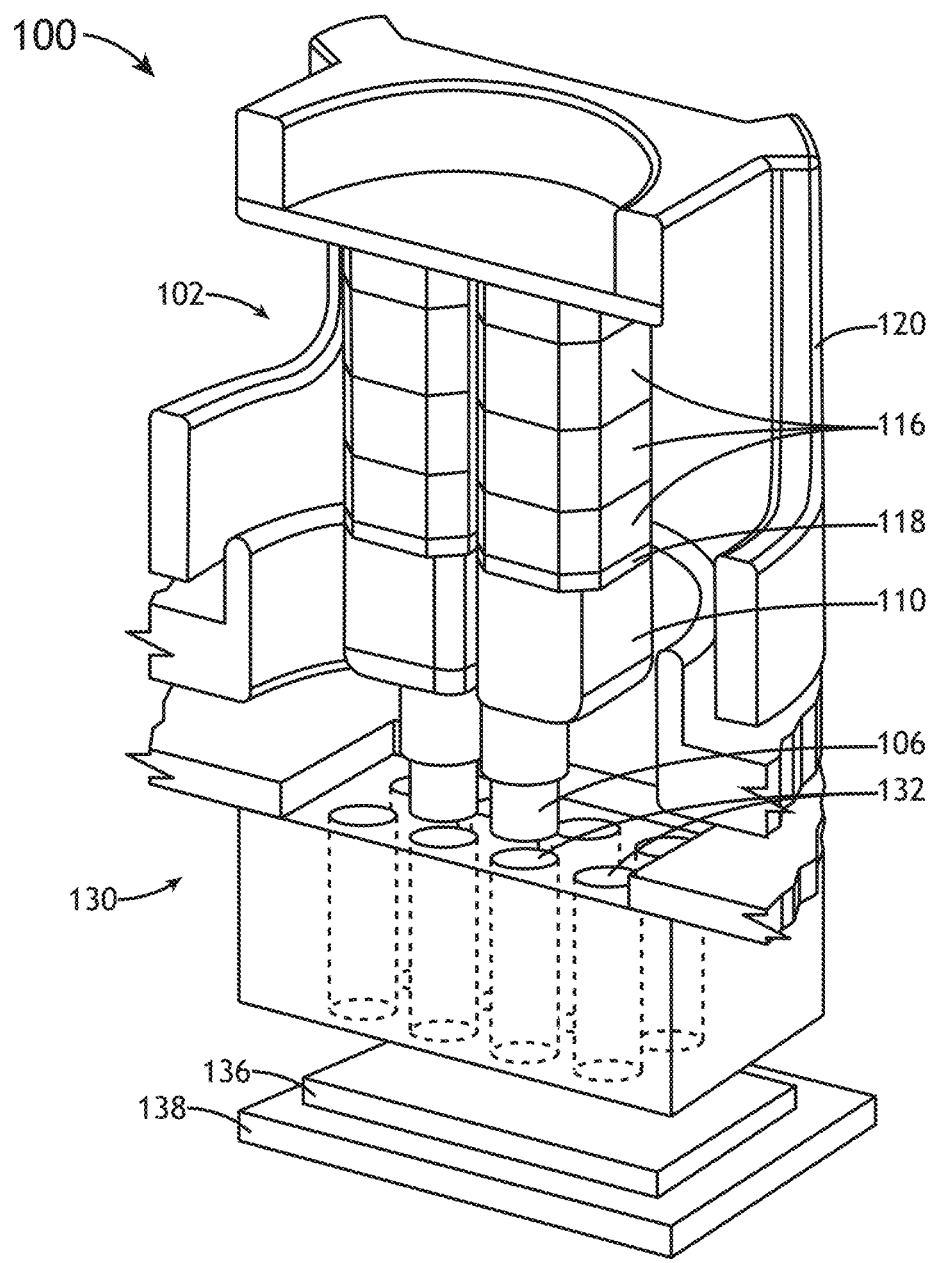
FIG. 1E illustrates a simplified schematic view of an SEM review tool including multiple electron beam sources, in accordance with one or more embodiments of the present disclosure.
Figure 1F:
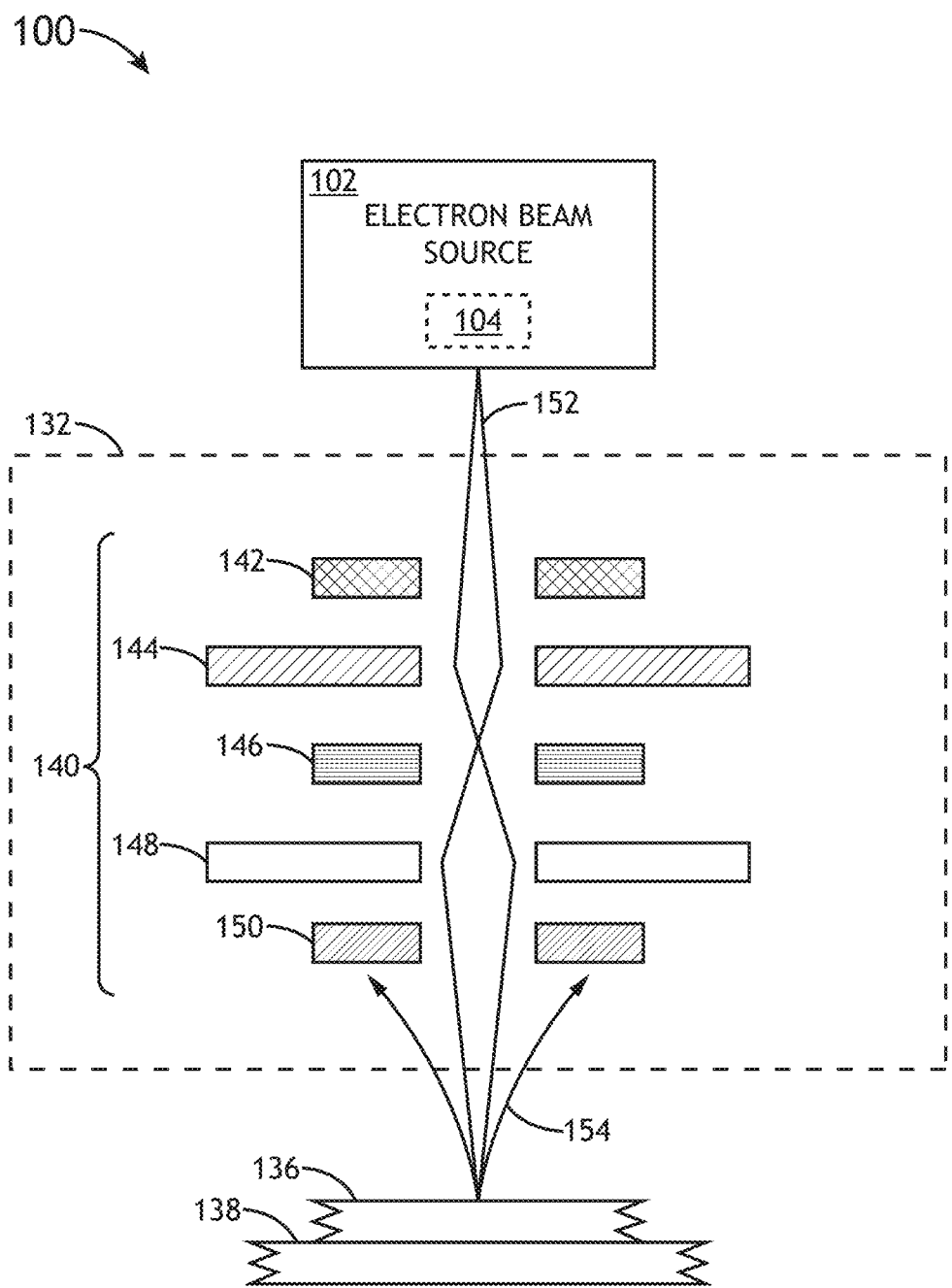
FIG. 1F illustrates a simplified block diagram of an electron-optical column of an SEM review tool, in accordance with one or more embodiments of the present disclosure.

FIGS. 1E and 1F illustrate a simplified schematic view of an SEM review tool 100, in accordance with one or more embodiments of the present disclosure.

In one embodiment, the SEM review tool 100 is a multi-column SEM review tool 100. It is noted herein, however, that the SEM review tool 100 may include, but is not limited to, a secondary electron (SE) review tool 100, a multi-beam SEM review tool 100, or the like. Therefore, the above description should not be interpreted as a limitation on the scope of the present disclosure but merely an illustration.

In another embodiment, the multi-column SEM review tool 100 includes the electron-optical column array 130. In another embodiment, the electron-optical column array 130 includes two or more electron-optical columns 132. Although FIG. 1E illustrates two electron beam sources 104 within the electron beam source array 102, it is noted herein that the SEM review tool 100 may include one electron beam source 104 per electron-optical column 132. Therefore, the above description should not be interpreted as a limitation on the scope of the present disclosure but merely an illustration.

Referring now to FIG. 1F, in another embodiment the two or more electron-optical columns 132 each include one or more electron-optical elements 140. For example, the one or more electron-optical elements 140 may include, but are not limited to, one or more electrostatic lenses, one or more electromagnetic lenses, or the like. For instance, the one or more electron-optical elements 140 may include, but are not limited to, one or more apertures 142, one or more condenser lenses 144, one or more beam deflectors 146 or scanning coils 146, one or more objective lenses 148, or the like. By way of another example, the one or more electron-optical elements 140 include one or more electron detectors 150. For instance, the one or more electron-optical elements 140 may include, but are not limited to, one or more electron detectors 150 positioned within the electron-optical column 132. In addition, the one or more electron-optical elements 140 may include, but are not limited to, one or more secondary electron detectors positioned outside the electron-optical column 132 (e.g., outside at least one outer-ring electron-optical column 132 where the electron-optical columns 132 of the electron-optical column array 130 are arranged in an outer ring and at least one inner ring).

In another embodiment, the electron beam source 104 generates an electron beam 152. For example, where there are two or more electron beam sources 104, the two or more electron beam sources 104 may generate an electron beam 152 specific to a particular electron-optical column 132 of the electron-optical column array 130. By way of another example, where there are two or more electron beam sources 104, the two or more electron beam sources 104 may generate an electron beam 152 that is split and/or directed to two or more electron-optical columns 132 of the electron-optical column array 130 via one or more electron-optical elements located between the two or more electron beam sources 104 and the two or more electron-optical columns 132.

In another embodiment, the electron-optical column 132 directs at least a portion of the electron beam 152 onto a sample 136 secured on a sample stage 138. In another embodiment, the sample 136 may backscatter, emit, radiate, and/or deflect one or more electrons 154 in response to the electron beam 152. In another embodiment, the one or more electron detectors 150 may detect the one or more electrons 154 backscattered, radiated, and/or deflected from the surface of the sample 136.

The sample 136 may include any sample suitable for inspection and/or review. In one embodiment, the sample 136 includes a photomask/reticle, semiconductor wafer, or the like. As used through the present disclosure, the term "wafer" refers to a substrate formed of a semiconductor and/or a non-semiconductor material. For instance, in the case of a semiconductor material, the wafer may be formed from, but is not limited to, monocrystalline silicon, gallium arsenide, and/or indium phosphide. As such, the term "wafer" and the term "sample" may be used interchangeably in the present disclosure. Therefore, the above description should not be interpreted as a limitation on the scope of the present disclosure but merely an illustration.

It is noted herein that many different types of devices may be formed on a wafer, and the term wafer as used herein is intended to encompass a wafer on which any type of device known in the art is being fabricated. Therefore, the above description should not be interpreted as a limitation on the scope of the present disclosure but merely an illustration.

The sample stage 138 may include any appropriate mechanical and/or robotic assembly known in the art of electron beam microscopy. In one embodiment, the sample stage 138 is an actuatable stage. For example, the sample stage 138 may include, but is not limited to, one or more translational stages suitable for selectively translating the sample 136 along one or more linear directions (e.g., x-direction, y-direction, and/or z-direction). By way of another example, the sample stage 138 may include, but is not limited to, one or more rotational stages suitable for selectively rotating the sample 136 along a rotational direction. By way of another example, the sample stage 138 may include, but is not limited to, a rotational stage and a translational stage suitable for selectively translating the sample 136 along a linear direction and/or rotating the sample 136 along a rotational direction. By way of another example, the sample stage 138 may be configured to translate or rotate the sample 136 for positioning, focusing, and/or scanning in accordance with a selected inspection or metrology algorithm, several of which are known to the art.

Although embodiments of the present disclosure are directed to an SEM review tool 100, it is noted herein any of the embodiments directed to the SEM review tool 100 and/or components of the SEM review tool 100 may be directed to a focused ion beam (FIB) review tool and/or components of the FIB review tool, for purposes of the present disclosure. In addition, it is noted herein any of the embodiments directed to the SEM review tool 100 and/or components of the SEM review tool 100 may be directed to any appropriate characterization tool known in the art. In a general sense, the characterization tool may include any characterization tool suitable for characterizing one or more samples, such as, but not limited to, photomasks/reticles, or wafers. Therefore, the above description should not be interpreted as a limitation on the scope of the present disclosure but merely an illustration.

Although embodiments of the present disclosure are directed to an electron-based characterization tool (e.g., SEM review tool 100), it is noted herein any of the embodiments directed to the SEM review tool 100 and/or components of the SEM review tool 100 may be directed to a characterization tool including an optical inspection tool. For example, the optical inspection tool may include an optical inspection tool capable of operating at a wavelength corresponding to, but not limited to, visible light, DUV radiation, UV radiation, VUV radiation, EUV radiation, and/or X-ray radiation.

Figure 2:
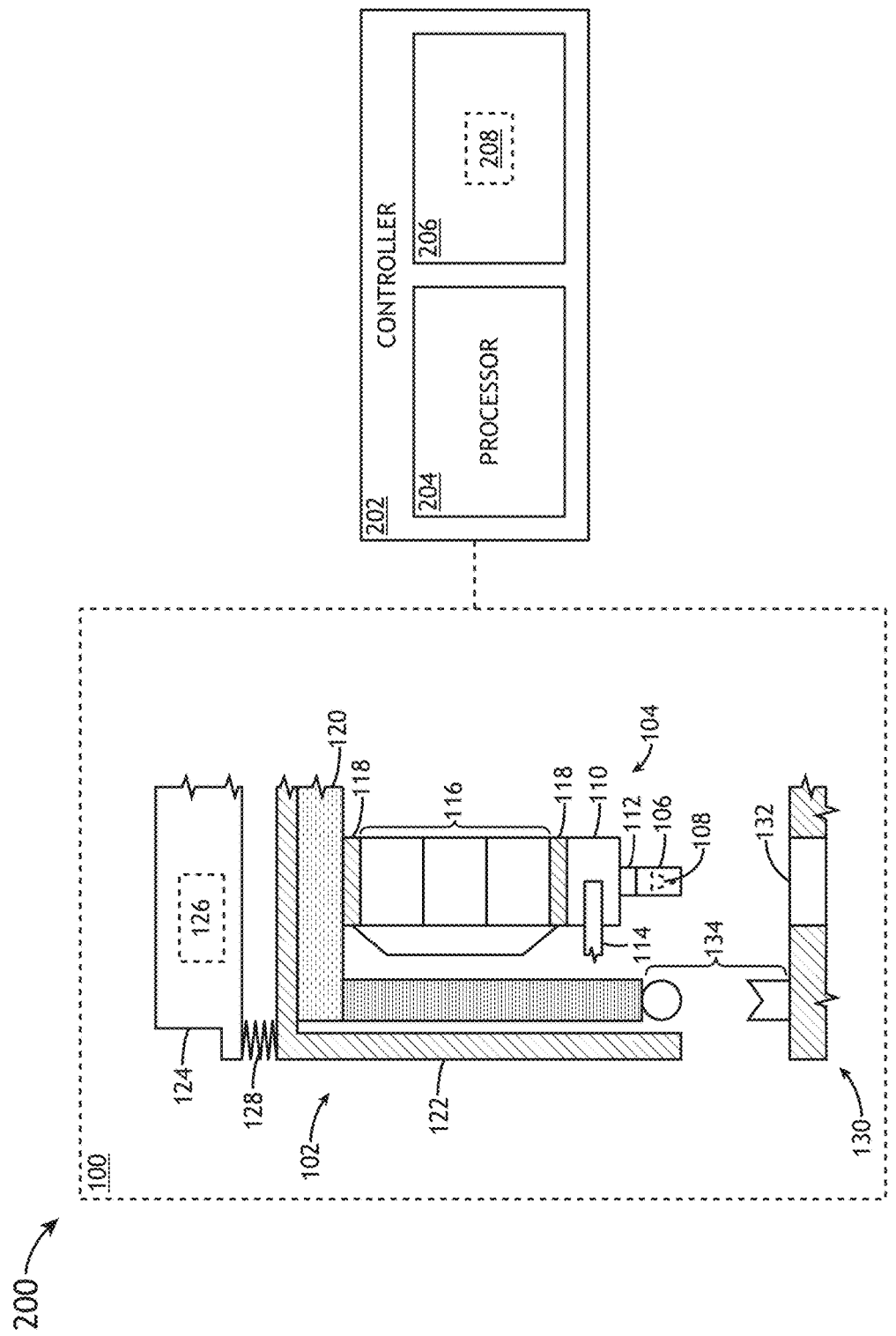
FIG. 2 illustrates a simplified schematic view of a characterization system including a controller, in accordance with one or more embodiments of the present disclosure.

FIG. 2 illustrates a characterization system 200 including a characterization tool and a controller 202, in accordance with one or more embodiments of the present disclosure.

In one embodiment, the characterization tool is the SEM review tool 100. In another embodiment, the controller 202 is operably coupled to one or more components of the SEM review tool 100. For example, the controller 202 may be operably coupled to the electron beam source array 102 and/or components of the electron beam source array 102 (e.g., the one or more electron beam sources 104 including the stack of one or more positioners 116, or the like), the electron-optical column assembly 130 and/or components of the electron-optical column assembly 130 (e.g., the one or more electron-optical columns 132 including electrostatic lenses, electromagnetic lenses, detectors, or the like), and/or the sample stage 138. In this regard, the controller 202 may direct any of the components of the characterization tool 100 to carry out any one or more of the various functions described throughout the present disclosure.

In another embodiment, the controller 202 includes one or more processors 204 and memory 206. In another embodiment, the memory 206 stores a set of program instructions 208. In another embodiment, the set of program instructions 208 is configured to cause the one or more processors 204 to carry out any of the one or more process steps described throughout the present disclosure.

The controller 202 may be configured to receive and/or acquire data or information from other systems or tools (e.g., one or more sets of information from the electron beam source array 102 and/or components of the electron beam source array 102 including the one or more electron beam sources 104 with the stack of one or more positioners 116, or the like), the electron-optical column assembly 130 and/or components of the electron-optical column assembly 130 (e.g., the one or more electron-optical columns 132 including electrostatic lenses, electromagnetic lenses, detectors, or the like, and/or the sample stage 138) of the characterization tool 100 by a transmission medium that may include wireline and/or wireless portions. In addition, the controller 202 may be configured to transmit data or information (e.g., the output of one or more procedures of the inventive concepts disclosed herein) to one or more systems or tools (e.g., one or more sets of information from the electron beam source array 102 and/or components of the electron beam source array 102 with the one or more electron beam sources 104 including the stack of one or more positioners 116, or the like), the electron-optical column assembly 130 and/or components of the electron-optical column assembly 130 (e.g., the one or more electron-optical columns 132 including electrostatic lenses, electromagnetic lenses, detectors, or the like, and/or the sample stage 138) of the characterization tool 100 by a transmission medium that may include wireline and/or wireless portions. In this regard, the transmission medium may serve as a data link between the controller 202 and the other subsystems of the characterization tool 100. In addition, the controller 202 may be configured to send data to external systems via a transmission medium (e.g., network connection).

The one or more processors 204 may include any one or more processing elements known in the art. In this sense, the one or more processors 204 may include any microprocessor device configured to execute algorithms and/or program instructions. For example, the one or more processors 204 may consist of a desktop computer, mainframe computer system, workstation, image computer, parallel processor, handheld computer (e.g., tablet, smartphone, or phablet), or other computer system (e.g., networked computer). In general, the term "processor" may be broadly defined to encompass any device having one or more processing elements, which execute the set of program instructions 208 from a non-transitory memory medium (e.g., the memory 206). Moreover, different subsystems of the characterization tool 100 (e.g., one or more sets of information from the electron beam source array 102 and/or components of the electron beam source array 102 including the one or more electron beam sources 104 with the stack of one or more positioners 116, or the like), the electron-optical column assembly 130 and/or components of the electron-optical column assembly 130 (e.g., the one or more electron-optical columns 132 including electrostatic lenses, electromagnetic lenses, detectors, or the like, and/or the sample stage 138) may include processor or logic elements suitable for carrying out at least a portion of the steps described throughout the present disclosure. Therefore, the above description should not be interpreted as a limitation on the present disclosure but merely an illustration.

The memory 206 may include any storage medium known in the art suitable for storing the set of program instructions 208 executable by the associated one or more processors 204. For example, the memory 206 may include a non-transitory memory medium. For instance, the memory 206 may include, but is not limited to, a read-only memory (ROM), a random access memory (RAM), a magnetic or optical memory device (e.g., disk), a magnetic tape, a solid state drive, and the like. The memory 206 may be configured to provide display information to a display device of a user interface. In addition, the memory 206 may be configured to store user input information from a user input device of the user interface. The memory 206 may be housed in a common controller 202 housing with the one or more processors 204. The memory 206 may, alternatively or in addition, be located remotely with respect to the spatial location of the processors 204 and/or the controller 202. For instance, the one or more processors 204 and/or the controller 202 may access a remote memory 206 (e.g., server), accessible through a network (e.g., internet, intranet, and the like).

In one embodiment, the characterization system 200 includes a user interface. In another embodiment, the user interface is coupled to the controller 202 (e.g., physically coupled and/or communicatively coupled). In another embodiment, the user interface includes a display. In another embodiment, the user interface includes a user input device. In another embodiment, the display device is coupled to the user input device. For example, the display device may be coupled to the user input device by a transmission medium that may include wireline and/or wireless portions.

The display device may include any display device known in the art. For example, the display device may include, but is not limited to, a liquid crystal display (LCD). By way of another example, the display device may include, but is not limited to, an organic light-emitting diode (OLED) based display. By way of another example, the display device may include, but is not limited to a CRT (cathode ray tube) display. Those skilled in the art should recognize that a variety of display devices may be suitable for implementation in the present invention and the particular choice of display device may depend on a variety of factors, including, but not limited to, form factor, cost, and the like. In a general sense, any display device capable of integration with a user input device (e.g., touchscreen, bezel mounted interface, keyboard, mouse, trackpad, and the like) is suitable for implementation in the present invention.

The user input device may include any user input device known in the art. For example, the user input device may include, but is not limited to, a keyboard, a keypad, a touchscreen, a lever, a knob, a scroll wheel, a track ball, a switch, a dial, a sliding bar, a scroll bar, a slide, a handle, a touch pad, a paddle, a steering wheel, a joystick, a bezel input device, or the like. In the case of a touchscreen interface, those skilled in the art should recognize that a large number of touchscreen interfaces may be suitable for implementation in the present invention. For instance, the display device may be integrated with a touchscreen interface, such as, but not limited to, a capacitive touchscreen, a resistive touchscreen, a surface acoustic based touchscreen, an infrared based touchscreen, or the like. In a general sense, any touchscreen interface capable of integration with the display portion of a display device is suitable for implementation in the present invention. In another embodiment, the user input device may include, but is not limited to, a bezel mounted interface.

While embodiments of the present disclosure illustrate the controller 202 may be coupled to the characterization tool 100 or integrated into the characterization tool 100 as a component, the controller 202 is not an integral or required component of the characterization tool 100. In addition, while embodiments of the present disclosure illustrate a user interface may be coupled to the controller 202 or integrated into the controller 202 as a component, the user interface is not an integral or required component of the controller 202 or the characterization tool 100. Therefore, the above description should not be interpreted as a limitation on the scope of the present disclosure but merely an illustration.

In one embodiment, emissions from the electron beam emitters 106 of the electron beam source array 102 are read back and/or processed by one or more sets of electronics coupled to, and/or software stored on, the controller 202. In another embodiment, images generated by, or from a surface of, one or more components (e.g., electrostatic lenses, electromagnetic lenses, detectors 150, or the like) of the electron-optical column 132 are read back and/or processed by one or more sets of electronics coupled to, and/or software stored on, the controller 202.

In another embodiment, the stack of one or more positioners 116 are precision-controlled via the controller 202. For example, the stack of one or more positioners 116 may include one or more piezoelectric-actuated positioners, or actuators. By way of another example, the stack of one or more actuators 116 may be controlled via the controller 202 to move via motion (e.g., motion measured in sub-micron increments). In this regard, the stack of one or more positioners 116 may adjusted from within the UHV environment, such that minor adjustments necessary to offset deflection caused by an expanded emitter tip 108 when heated during operation of the SEM review tool 100 may be made.

In another embodiment, the electron beam emitters 106 include an extractor aperture. In one example, the extractor driving voltages may be independently set and/or calibrated for the electron beam emitters 106. In another example, the electric current on each extractor may be independently read and/or analyzed. The stack of the one or more positioners 116 of a particular electron beam emitter 106 may scan the area near the bore (e.g., hole or opening) of an electrostatic lens and/or electromagnetic lens in an electron-optical column 132 paired with the particular electron beam emitter 106. The electric current generated by the electron beam at the bore may be measured via an electrometer or amplifier communicatively coupled to the electrostatic lens and/or electromagnetic lens, while the stack of one or more positioners 116 scans the bore and surrounding areas. The electrometer or amplifier may scan the lens image to find the bore via a coarse alignment process and/or via a fine alignment process. The one or more xyz-manipulators, or actuators, 126 may be adjusted via the output generated from the coarse adjustment process and/or the stack of one or more piezoelectric-actuated positioners, or actuators, 116 may be adjusted by the output generated from the fine adjustment process. For instance, any of the one or more actuators 126 and/or the one or more actuators 116 may be independently and precisely positioned. In addition, at least some of the one or more actuators 126 and/or the one or more actuators 116 may be positioned as a set or group. It is noted herein the independent, precise positioning may occur while the source electron beam array 102 is in a UHV environment and/or during operation.

In this regard, a position where the preferred (e.g., highest and/or previously predetermined) percentage of a generated electron beam passes through the paired electron-optical column 132 may be determined through automated analysis of the scanned positions and the measured current for each position.

Although embodiments of the present disclosure are directed to the stack of one or more positioners 116 including electrically-driven actuators 116, it is noted herein the positioners 116 may be mechanically-driven (e.g., via a push-pull assembly, a flexure assembly, or the like). Therefore, the above description should not be interpreted as a limitation on the scope of the present disclosure, but merely an illustration.

Although embodiments of the present disclosure are directed to a characterization tool of the characterization system 200 as including the SEM review tool 100, it is noted herein the characterization tool of the characterization system 200 may include a FIB review tool or an optical inspection tool. Therefore, the above description should not be interpreted as a limitation on the scope of the present disclosure but merely an illustration.

FIGS. 3A-3E generally illustrate a test chamber 300 coupled to the SEM review tool 100, in accordance with one or more embodiments of the present disclosure.

In one embodiment, the test chamber 300 is a vacuum vessel capable of operating under an ultra-high vacuum (UHV) environment. In another embodiment, the test chamber 300 includes a housing 302. In another embodiment, the housing 302 includes a viewport 304. In another embodiment, the electron beams 152 generated by the electron beam emitters 106 of the electron beam sources 104 are visible through the viewport 304. For example, all electron beam emitters 106 may share the same test chamber 300. In another embodiment, the viewport 304 may be utilized to inspect the electron beam sources 104. For example, one or more imaging devices (e.g., camera, detector, pyrometer, vibrometer, or the like) may be positioned in front of the viewport 304 (e.g., the viewport 304 is within a line of sight of the one or more imaging devices). In this regard, the viewport 304 may be utilized to inspect the electron beams 152 via one or more processes including, but not limited to, visual inspection or calibration, pyrometry (e.g., thermal calibration) or vibrometry. In addition, the electron beam sources 104 may be adjusted to obtain a selected and/or predetermined temperature (or color) of the emitter tips 108 in the electron beam sources 104 (e.g., set the temperature to meet a preferred length of life for the electron beam source 104 before burn-out of the emitter tip 108) and/or to offset misalignment caused by the increased temperature of the emitter tips 108 in the electron beam sources 104 during operation.

Figure 3A:
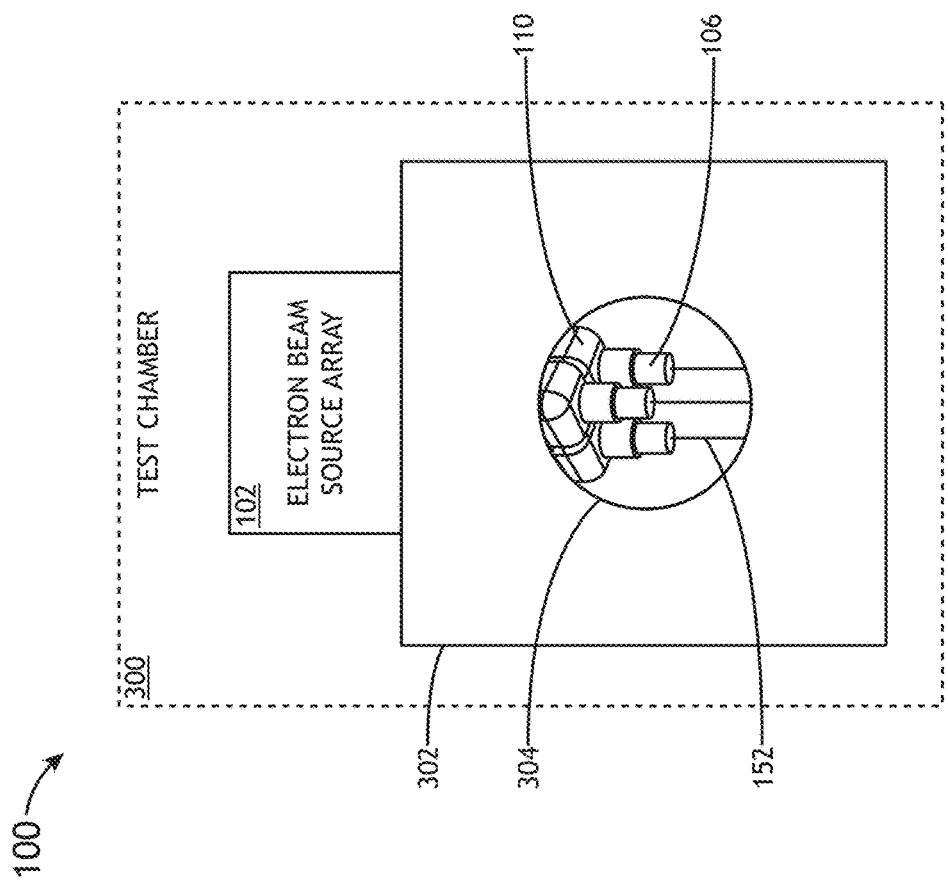
FIG. 3A illustrates a simplified schematic view of an SEM review tool test chamber including a viewport for inspecting electron beams, in accordance with one or more embodiments of the present disclosure.
Figure 3B:
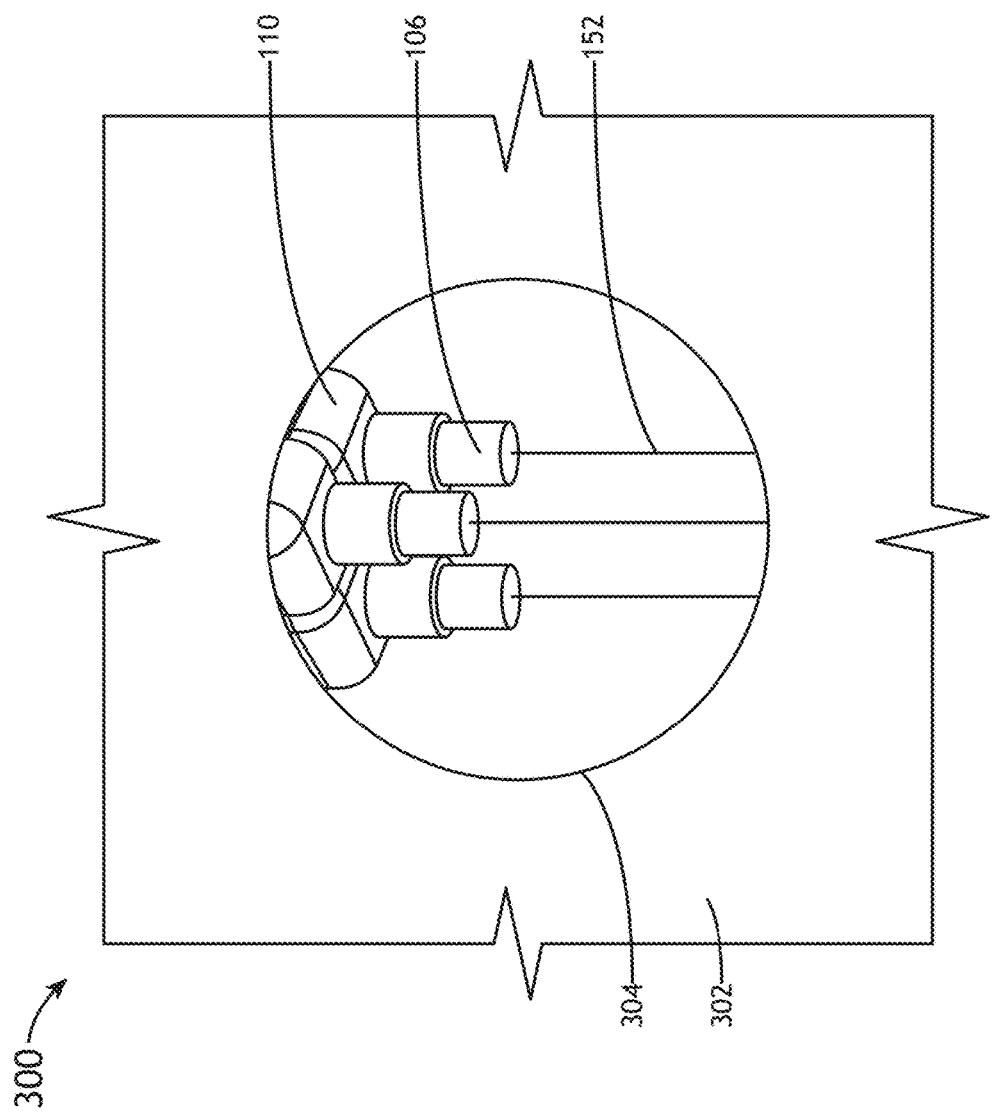
FIG. 3B illustrates a simplified schematic view of an SEM review tool test chamber including a viewport for inspecting electron beams, in accordance with one or more embodiments of the present disclosure.
Figure 3C:
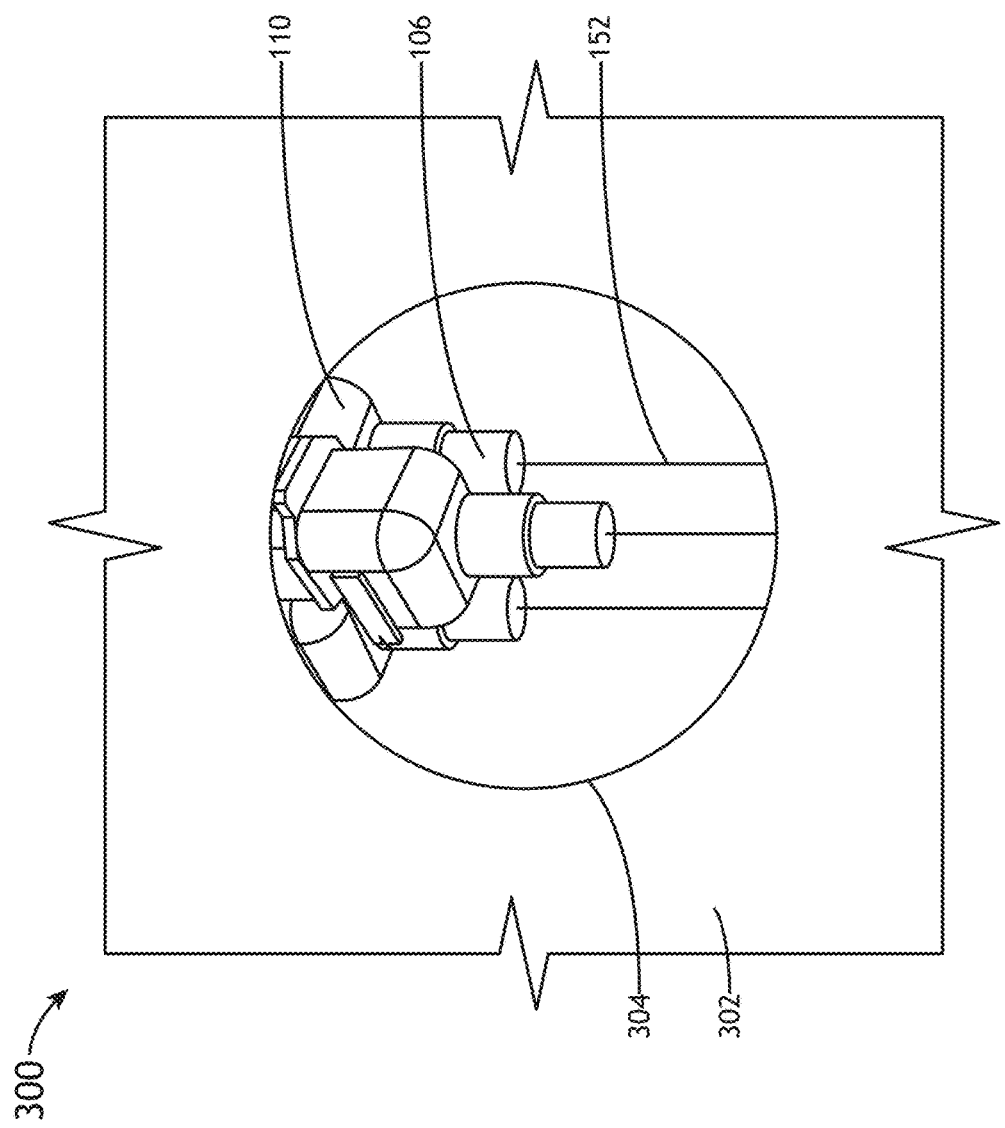
FIG. 3C illustrates a simplified schematic view of an SEM review tool test chamber including a viewport for inspecting electron beams, in accordance with one or more embodiments of the present disclosure.
Figure 3D:
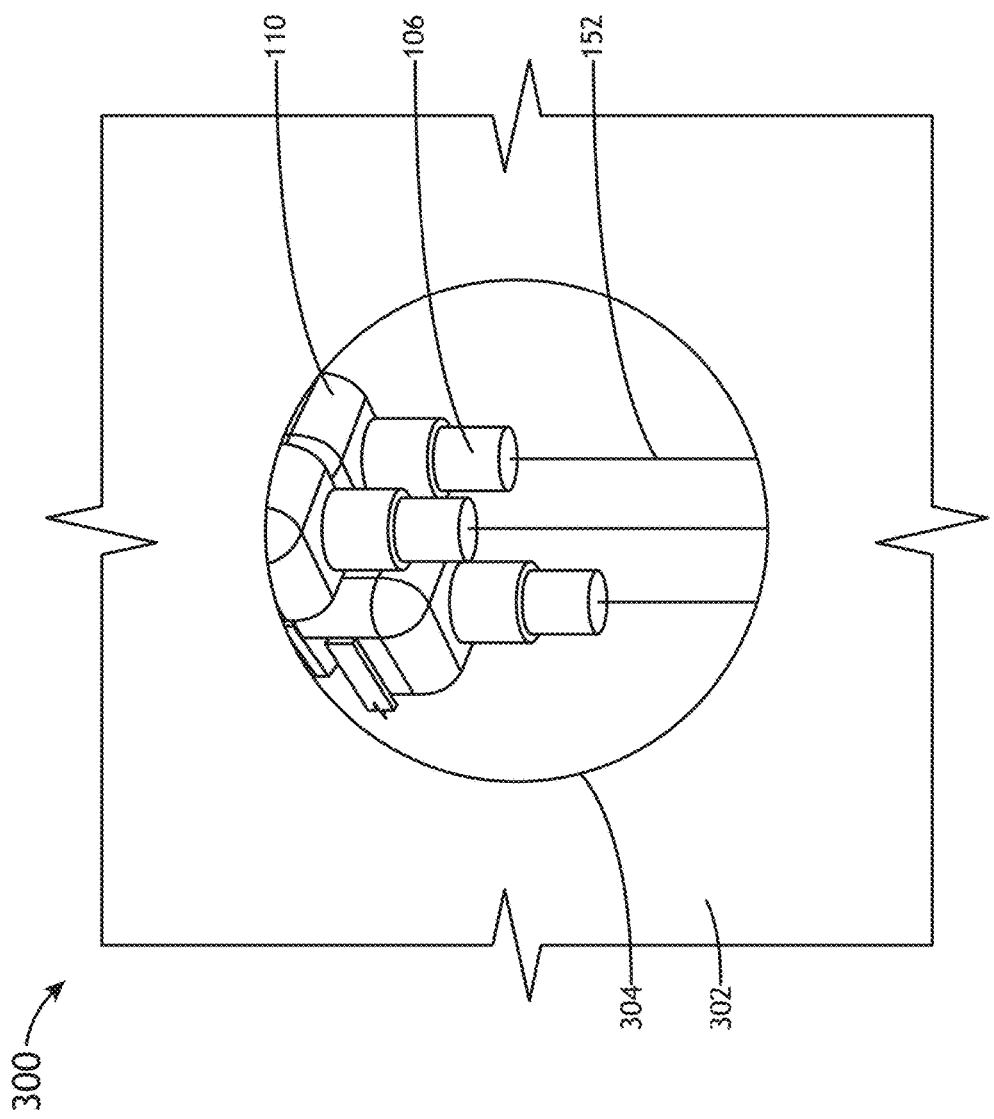
FIG. 3D illustrates a simplified schematic view of an SEM review tool test chamber including a viewport for inspecting electron beams, in accordance with one or more embodiments of the present disclosure.
Figure 3E:
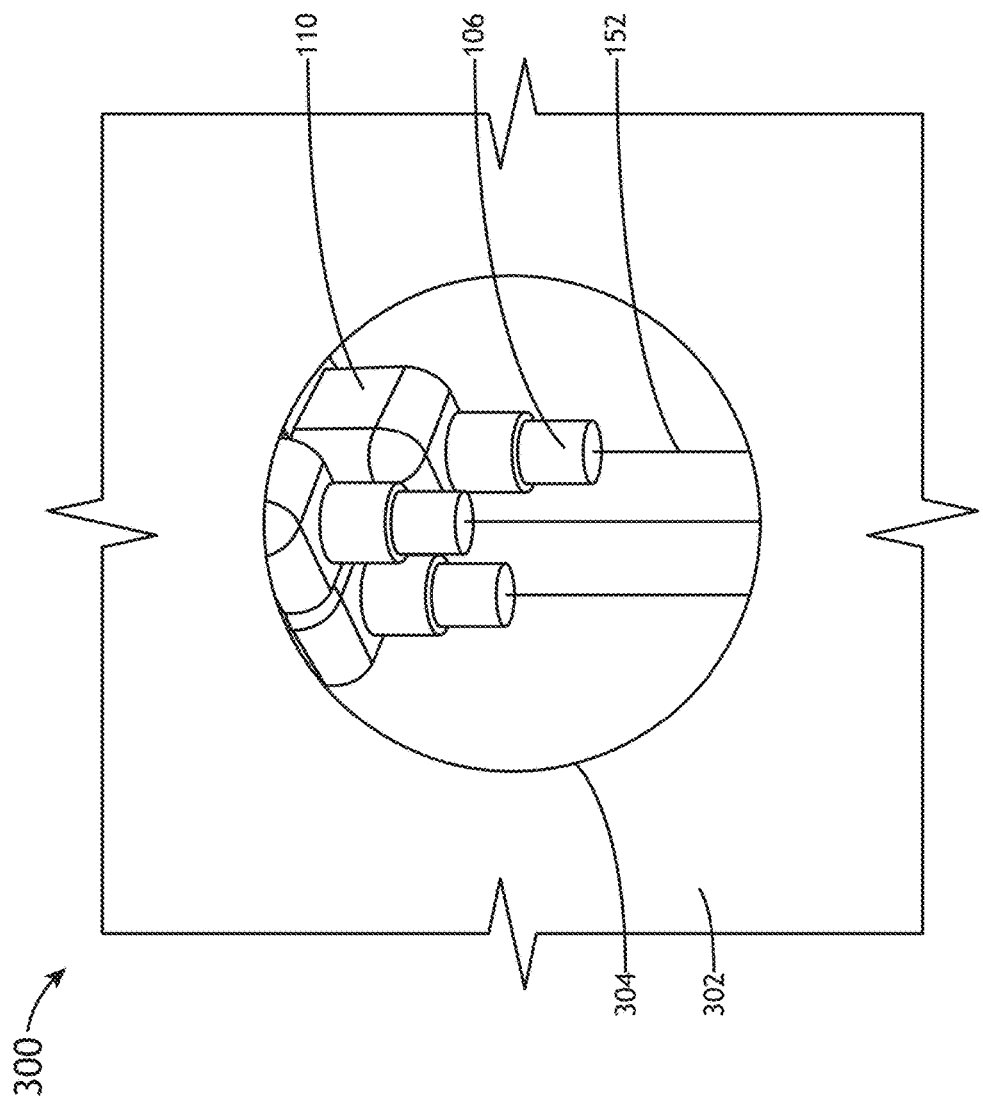
FIG. 3E illustrates a simplified schematic view of an SEM review tool test chamber including a viewport for inspecting electron beams, in accordance with one or more embodiments of the present disclosure.

In one example, the source tower 124 may be utilized when inspecting the electron beams 152 through the viewport 304. As illustrated in FIG. 3B, the source tower 124 may raise the electron beam source array 102 from the electron-optical column array 130. As illustrated in FIGS. 3C-3E, the source tower 124 may lower each of the electron beam sources 104 in front of the viewport 304 to allow for inspection of the electron beam 152, and then raise the electron beam source 104 back into position following inspection, in sequential order. Following inspection, the source tower 124 may lower the electron beam source array 102 into place, with the kinematic mount assemblies 134 acting as guides. Each electron beam source 104 may be fine-adjusted via the coupled-to stack of one or more positioners 116. In this regard, the same position may be repeatedly achieved each time the electron beam source array 102 is disengaged and re-engaged with the electron-optical column array 130. In addition, the electron beam emitters 106 may be coupled to the electron-optical column 132 in a manner so as to ensure a preferred and/or predetermined dynamics performance (e.g., ensure a preferred and/or predetermined level of vibration).

Figure 4A:
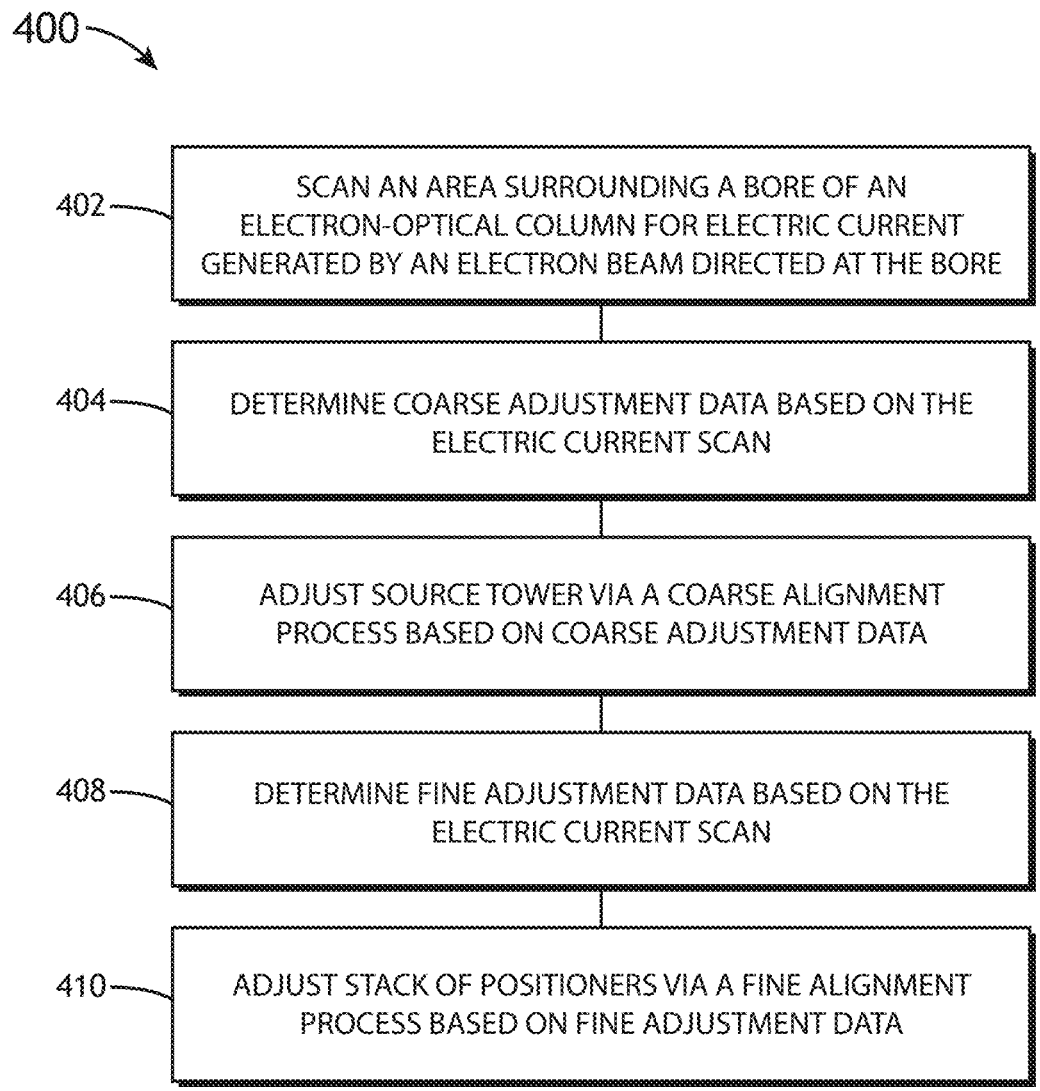
FIG. 4A illustrates a process flow diagram depicting a method for calibrating an electron beam in an SEM review tool, in accordance with one or more embodiments of the present disclosure.

FIG. 4A illustrates a process flow diagram depicting a method 400 for calibrating electron beams 152 generated by the SEM review tool 100, in accordance with one or more embodiments of the present disclosure. It is noted herein the method 400 is not limited to the steps provided. For example, the method 400 may instead include more or fewer steps. By way of another example, the method 400 may perform the steps in an order other than provided. Therefore, the above description should not be interpreted as a limitation on the scope of the present disclosure, but merely an illustration.

In step 402, an area surrounding a bore of an electron-optical column is scanned for an electric current generated by an electron beam directed at the bore. In one embodiment, an electron beam emitter 106 of an electron beam source 104 is paired with an electron-optical column 132 of the electron-optical column array 130. In another embodiment, the electron beam emitter 106 generates an electron beam 152 and directs it near the bore of the electron-optical column 132. In another embodiment, the electron beam 152 is scanned across the area surrounding the bore of the electron-optical column 132. In another embodiment, the electric current generated by the electron beam 152 is measured via an electrometer.

In step 404, coarse adjustment data is determined from the electric current measurements. In one embodiment, the coarse adjustment data is calculated from the electric current measurements. In another embodiment, the coarse adjustment data is retrieved from stored data corresponding to the electric current measurements. In step 406, the source tower 124 (e.g., the one or more actuators 126 of the source tower 124) is adjusted (e.g., along an x-axis, a y-axis, and/or a z-axis) via a coarse alignment process based on the coarse adjustment data.

In step 408, fine adjustment data is determined from the electric current measurements. In one embodiment, the fine adjustment data is calculated from the electric current measurements. In another embodiment, the fine adjustment data is retrieved from stored data corresponding to the electric current measurements. In step 410, the stack of one or more positioners 116 is adjusted (e.g., along an x-axis, a y-axis, and/or a z-axis) via a fine alignment process based on the fine adjustment data.

In this regard, a preferred position (e.g., a position where the highest percentage of a generated electron beam passes through the paired electron-optical column) may be determined through automated analysis of the scanned positions and the measured current for each position. For example, the preferred position may be determined within an UHV environment during operation of the SEM review tool 100.

Figure 4B:
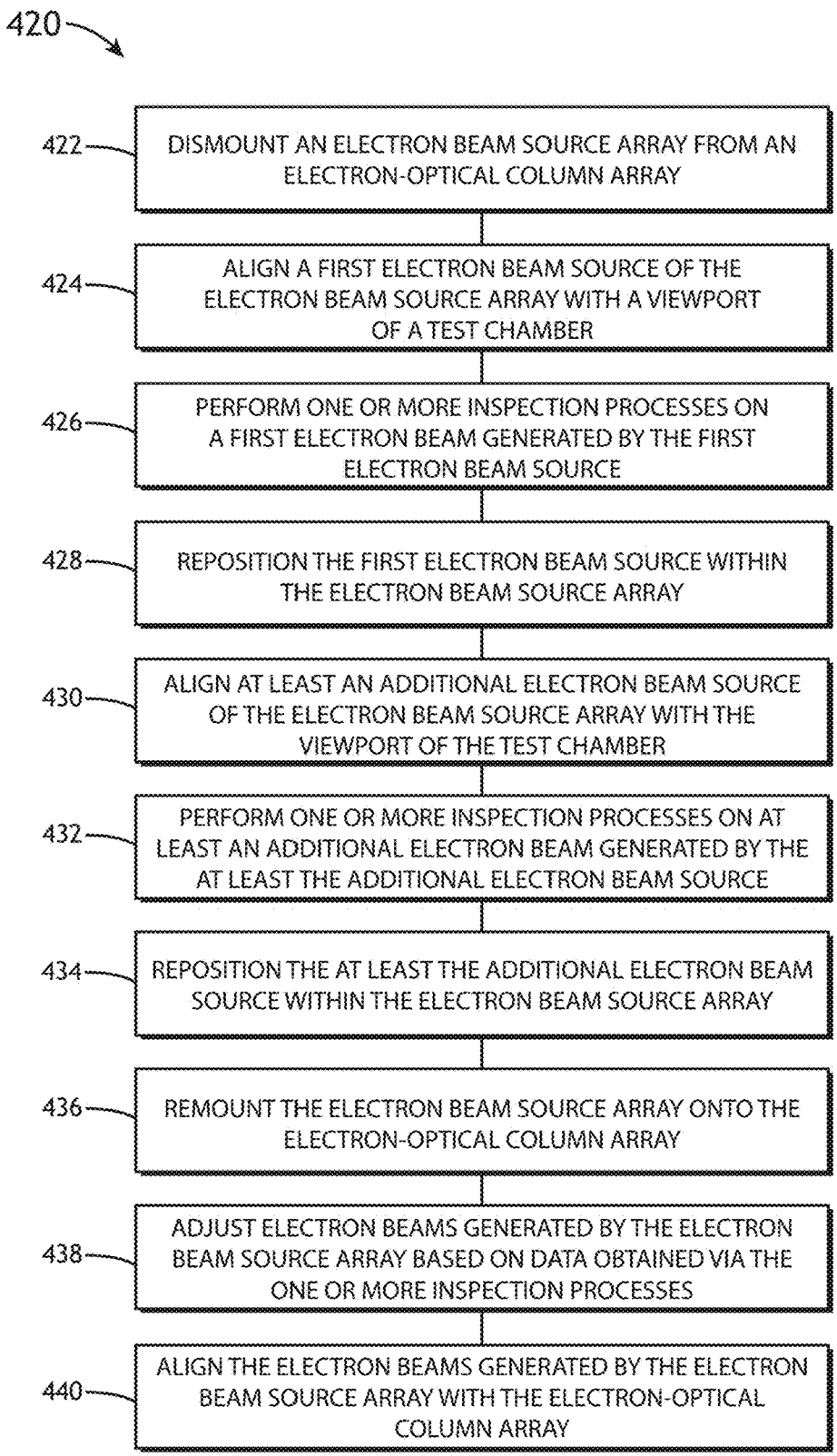
FIG. 4B illustrates a process flow diagram depicting a method for inspecting a source electron beam array of an SEM review tool, in accordance with one or more embodiments of the present disclosure.

FIG. 4B illustrates a process flow diagram depicting a method 420 for inspecting a source electron beam array 102 of the SEM review tool 100, in accordance with one or more embodiments of the present disclosure. It is noted herein the method 420 is not limited to the steps provided. For example, the method 420 may instead include more or fewer steps. By way of another example, the method 420 may perform the steps in an order other than provided. Therefore, the above description should not be interpreted as a limitation on the scope of the present disclosure, but merely an illustration.

In step 422, the electron beam source array 102 is dismounted from the electron-optical column array 130. In one embodiment, the kinematic mount assemblies 134 between the carrier plate 120 of the electron beam source array 102 and the electron-optical column array 130 is uncoupled. In another embodiment, the source tower 124 raises the electron beam source array 102.

In step 424, a first electron beam source 104 of the electron beam source array 102 is aligned in front of the viewport 304 of the test chamber 300. In one embodiment, the first electron beam source 104 is lowered in front of the viewport 304 during operation. In step 426, the electron beam 152 generated by the first electron beam source 104 is measured and/or analyzed via one or more inspection processes. For example, the one or more inspection processes may include, but are not limited to, optical inspection, pyrometry, vibrometry, or the like. In step 428, the first electron beam source 104 of the electron beam source array 102 is repositioned within the electron beam source array 102.

In step 430, at least an additional electron beam source 104 of the electron beam source array 102 is aligned in front of the viewport 304 of the test chamber 300. In one embodiment, the at least the additional electron beam source 104 is lowered in front of the viewport 304 during operation. In step 432, the electron beam 152 generated by the at least the additional electron beam source 104 is measured and/or analyzed via one or more inspection processes. For example, the one or more inspection processes may include, but are not limited to, optical inspection, pyrometry, vibrometry, or the like. In step 434, the at least the additional electron beam source 104 of the electron beam source array 102 is repositioned within the electron beam source array 102.

In step 436, the electron beam source array 102 is remounted on the electron-optical column array 130. In one embodiment, the kinematic mount assemblies 134 between the carrier plate 120 of the electron beam source array 102 and the electron-optical column array 130 are coupled together. In another embodiment, the source tower 124 repositions the electron beam source array 102 via one or more coarse alignment processes.

In step 438, the position of the electron beams 152 generated by the electron beam source array 102 are adjusted based on data obtained via the one or more inspection processes. In step 440, the electron beams 152 generated by the electron beam source array 102 are aligned with the electron-optical columns 132 of the electron-optical column array 130. In one embodiment, the electron beams 152 generated by the electron beam source array 102 are aligned with the electron-optical columns 132 of the electron-optical column array 130 via one or more steps of method 400.

Advantages of the present disclosure are directed to a multi-emitter, multi-column scanning electron microscopy (SEM) tool. Advantages of the present disclosure are also directed to wafer inspection or lithography via high brightness emission for each column in the multi-column SEM tool. Advantages of the present disclosure are also directed to automated alignment of an electron beam through a column aperture or extractor bore of an electron-optical column. Advantages of the present disclosure are also directed to in-situ visual, thermal, and/or vibration inspection of individual or group electron beam sources within an electron beam source array. Advantages of the present disclosure are also directed to in-situ calibration of individual or group electron beam sources within an electron beam source array.

Those having skill in the art will recognize that the state of the art has progressed to the point where there is little distinction left between hardware, software, and/or firmware implementations of aspects of systems; the use of hardware, software, and/or firmware is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

In some implementations described herein, logic and similar implementations may include software or other control structures. Electronic circuitry, for example, may have one or more paths of electrical current constructed and arranged to implement various functions as described herein. In some implementations, one or more media may be configured to bear a device-detectable implementation when such media hold or transmit device-detectable instructions operable to perform as described herein. In some variants, for example, implementations may include an update or modification of existing software or firmware, or of gate arrays or programmable hardware, such as by performing a reception of or a transmission of one or more instructions in relation to one or more operations described herein. Alternatively or in addition, in some variants, an implementation may include special-purpose hardware, software, firmware components, and/or general-purpose components executing or otherwise invoking special-purpose components. Specifications or other implementations may be transmitted by one or more instances of tangible transmission media as described herein, optionally by packet transmission or otherwise by passing through distributed media at various times.

Alternatively, or additionally, implementations may include executing a special-purpose instruction sequence or invoking circuitry for enabling, triggering, coordinating, requesting, or otherwise causing one or more occurrences of virtually any functional operations described herein. In some variants, operational or other logical descriptions herein may be expressed as source code and compiled or otherwise invoked as an executable instruction sequence. In some contexts, for example, implementations may be provided, in whole or in part, by source code, such as C++, or other code sequences. In other implementations, source or other code implementation, using commercially available and/or techniques in the art, may be compiled/implemented/translated/converted into a high-level descriptor language (e.g., initially implementing described technologies in C, C++, python, Ruby on Rails, Java, PHP, .NET, or Node.js programming language and thereafter converting the programming language implementation into a logic-synthesizable language implementation, a hardware description language implementation, a hardware design simulation implementation, and/or other such similar mode(s) of expression). For example, some or all of a logical expression (e.g., computer programming language implementation) may be manifested as a Verilog-type hardware description (e.g., via Hardware Description Language (HDL) and/or Very High Speed Integrated Circuit Hardware Descriptor Language (VHDL)) or other circuitry model which may then be used to create a physical implementation having hardware (e.g., an Application Specific Integrated Circuit). Those skilled in the art will recognize how to obtain, configure, and optimize suitable transmission or computational elements, material supplies, actuators, or other structures in light of these teachings.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link (e.g., transmitter, receiver, transmission logic, reception logic, etc.), etc.).

In a general sense, those skilled in the art will recognize that the various embodiments described herein can be implemented, individually and/or collectively, by various types of electro-mechanical systems having a wide range of electrical components such as hardware, software, firmware, and/or virtually any combination thereof; and a wide range of components that may impart mechanical force or motion such as rigid bodies, spring or torsional bodies, hydraulics, electro-magnetically actuated devices, and/or virtually any combination thereof. Consequently, as used herein "electro-mechanical system" includes, but is not limited to, electrical circuitry operably coupled with a transducer (e.g., an actuator, a motor, a piezoelectric crystal, a Micro Electro Mechanical System (MEMS), etc.), electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of memory (e.g., random access, flash, read only, etc.)), electrical circuitry forming a communications device (e.g., a modem, communications switch, optical-electrical equipment, etc.), and/or any non-electrical analog thereto, such as optical or other analogs. Those skilled in the art will also appreciate that examples of electro-mechanical systems include but are not limited to a variety of consumer electronics systems, medical devices, as well as other systems such as motorized transport systems, factory automation systems, security systems, and/or communication/computing systems. Those skilled in the art will recognize that electro-mechanical as used herein is not necessarily limited to a system that has both electrical and mechanical actuation except as context may dictate otherwise.

In a general sense, those skilled in the art will recognize that the various aspects described herein which can be implemented, individually and/or collectively, by a wide range of hardware, software, firmware, and/or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of memory (e.g., random access, flash, read only, etc.)), and/or electrical circuitry forming a communications device (e.g., a modem, communications switch, optical-electrical equipment, etc.). Those having skill in the art will recognize that the subject matter described herein may be implemented in an analog or digital fashion or some combination thereof.

Those skilled in the art will recognize that at least a portion of the devices and/or processes described herein can be integrated into a data processing system. Those having skill in the art will recognize that a data processing system generally includes one or more of a system unit housing, a video display device, memory such as volatile or non-volatile memory, processors such as microprocessors or digital signal processors, computational entities such as operating systems, drivers, graphical user interfaces, and applications programs, one or more interaction devices (e.g., a touch pad, a touch screen, an antenna, etc.), and/or control systems including feedback loops and control motors (e.g., feedback for sensing position and/or velocity; control motors for moving and/or adjusting components and/or quantities). A data processing system may be implemented utilizing suitable commercially available components, such as those typically found in data computing/communication and/or network computing/communication systems.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken limiting.

Although a user is described herein as a single figure, those skilled in the art will appreciate that the user may be representative of a human user, a robotic user (e.g., computational entity), and/or substantially any combination thereof (e.g., a user may be assisted by one or more robotic agents) unless context dictates otherwise. Those skilled in the art will appreciate that, in general, the same may be said of "sender" and/or other entity-oriented terms as such terms are used herein unless context dictates otherwise.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components, and/or wirelessly interactable, and/or wirelessly interacting components, and/or logically interacting, and/or logically interactable components.

In some instances, one or more components may be referred to herein as "configured to," "configurable to," "operable/operative to," "adapted/adaptable," "able to," "conformable/conformed to," etc. Those skilled in the art will recognize that such terms (e.g., "configured to") can generally encompass active-state components and/or inactive-state components and/or standby-state components, unless context requires otherwise.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a"

and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

With respect to the appended claims, those skilled in the art will appreciate that recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

Although particular embodiments of this invention have been illustrated, it is apparent that various modifications and embodiments of the invention may be made by those skilled in the art without departing from the scope and spirit of the foregoing disclosure. It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Accordingly, the scope of the invention should be limited only by the claims appended hereto.

What is claimed:

1. A scanning electron microscopy (SEM) system, comprising:
    an electron-optical column array comprising a plurality of electron-optical columns; and
    an electron beam source array couplable to the electron-optical column array, wherein the electron beam source array comprises:
        a plurality of electron beam sources configured to generate a plurality of electron beams, wherein at least some of the electron beam sources comprise: an emitter coupled to an emitter holder, wherein the emitter includes one or more emitter tips configured to generate one or more electron beams of the plurality of electron beams; and a stack of one or more positioners coupled to the emitter holder, wherein the stack of one or more positioners is configured to adjust a position of the emitter based on one or more measurements of the electron beam generated by the emitter, wherein the emitter is configured to scan the one or more electron beams across an area surrounding a bore of a particular electron-optical column of the plurality of electron-optical columns;
        a carrier plate coupled to the plurality of electron beam sources; and
        a source tower coupled to the carrier plate, wherein the source tower is configured to adjust a position of the plurality of electron beam sources relative to a position of the plurality of electron-optical columns.

2. The system in claim 1, wherein the emitter is configured to receive voltage via a voltage terminal coupled to the emitter holder.

3. The system in claim 2, wherein the emitter includes two or more emitter tips configured to receive voltage via the voltage terminal coupled to the emitter holder.

4. The system in claim 3, wherein at least a second emitter tip of the two or more emitter tips is configured to receive a selected amount of electric current when a first emitter tip of the two or more emitter tips fails.

5. The system in claim 1, wherein the at least some of the plurality of electron beam sources comprise:
    a thermal bypass, wherein the thermal bypass is positioned between the emitter holder and the stack of one or more positioners, wherein the thermal bypass is positioned between the stack of one or more positioners and the carrier plate, wherein the thermal bypass is configured to transfer heat from the emitter holder to the carrier plate.

6. The system in claim 1, wherein the electron beam source array comprises:
    a magnetic shield, wherein the magnetic shield surrounds the plurality of electron beam sources, wherein the carrier plate is coupled to the magnetic shield, wherein the source tower is coupled to the magnetic shield.

7. The system in claim 6, wherein the source tower is coupled to the magnetic shield via a flexible joint.

8. The system in claim 1, wherein an electron-optical element of at least one of the plurality of electron-optical columns comprises at least one of an electrostatic lens or an electromagnetic lens.

9. The system in claim 1, comprising a controller, wherein the controller includes one or more processors configured to receive one or more images from a characterization tool, wherein the controller includes memory configured to store a set of program instructions, wherein the one or more processors are configured to execute the set of program instructions.

10. The system in claim 9, wherein the stack of one or more positioners includes one or more actuators, wherein the one or more actuators are configured to adjust the position of the emitter based on the one or more measurements of the electron beam generated by the emitter.

11. The system in claim 10, wherein the controller is configured to adjust one or more actuators via one or more automated adjustment processes.

12. The system in claim 9, wherein the source tower includes one or more actuators, wherein the one or more actuators are configured to adjust the position of the plurality of electron beam sources relative to the position of the plurality of electron-optical columns.

13. The system in claim 12, wherein the controller is configured to adjust one or more actuators via one or more automated adjustment processes.

14. The system in claim 1, wherein at least one of the electron beam source array or the electron-optical column array includes one or more components fabricated from ultra-high vacuum (UHV) environment-compliant materials.

15. The system in claim 14, wherein the electron beam source array and the electron-optical column array share a UHV environment.

16. The system in claim 1, further comprising:
one or more kinematic mount assemblies, wherein the electron beam source array is couplable to the electron-optical column array via the one or more kinematic mount assemblies.

17. The system in claim 16, wherein the source tower is configured to adjust a position of the plurality of electron beam sources relative to a position of the plurality of electron-optical columns based on feedback from the one or more kinematic mount assemblies.

18. The system in claim 16, wherein the one or more kinematic mount assemblies include one or more safety switches.

19. The system in claim 18, wherein the source tower is configured to adjust a position of the plurality of electron beam sources relative to a position of the plurality of electron-optical columns based on feedback from the one or more safety switches.

20. The system in claim 16, wherein the carrier plate of the electron beam source array is couplable to the electron-optical column array via the one or more kinematic mount assemblies.

21. The system in claim 1, comprising a test chamber, wherein at least some of the plurality of electron beams are inspectable via a viewport of the test chamber.

22. The system in claim 21, comprising an inspection device, wherein the inspection device is configured to sequentially inspect the at least some of the plurality of electron beams via the viewport in the test chamber.

23. The system in claim 22, wherein the inspection device is configured to sequentially inspect the at least some of the plurality of electron beams via the viewport in the test chamber while the electron beam source array is dismounted from the electron-optical column array.

24. A scanning electron microscopy (SEM) system, comprising:
an electron-optical column array comprising a plurality of electron-optical columns; and
an electron beam source array couplable to the electron-optical column array, wherein the electron beam source array comprises a plurality of electron beam sources configured to generate a plurality of electron beams, wherein at least some of the electron beam sources comprise:
an emitter coupled to an emitter holder, wherein the emitter includes one or more emitters tips configured to generate one or more electron beams of the plurality of electron beams;
a stack of one or more actuators coupled to the emitter holder, wherein the stack of one or more actuators is configured to adjust a position of the emitter; and
a thermal bypass, wherein the thermal bypass is positioned between the emitter holder and the stack of one or more actuators, wherein the thermal bypass is positioned between the stack of one or more actuators and a carrier plate, wherein the thermal bypass is configured to transfer heat from the emitter holder to the carrier plate.

25. A scanning electron microscopy (SEM) system, comprising:
an electron-optical column array comprising a plurality of electron-optical columns; and
an electron beam source array couplable to the electron-optical column array, the electron beam source array comprising a plurality of electron beam sources configured to generate a plurality of electron beams, wherein at least some of the electron beam sources comprise an emitter, wherein the emitter includes a first emitter tip configured to generate a first electron beam of the plurality of electron beams when aligned with a particular electron-optical column of the plurality of electron-optical columns and a second emitter tip configured to generate a second electron beam of the plurality of electron beams when aligned with the particular electron-optical column of the plurality of electron-optical columns, wherein the second emitter tip is configured to receive a selected amount of electric current when the first emitter tip fails, wherein the second emitter tip is configured for alignment with the particular electron-optical column, via adjustment of a position of the emitter, when the first emitter tip fails.

26. A method, comprising:
scanning an area surrounding a bore of an electron-optical element of an electron-optical column for an electric current generated by an electron beam directed at the bore, wherein the electron-optical column is a component of an electron-optical column array;
determining coarse adjustment data based on the scanned electric current;
providing the coarse adjustment data to adjust a source tower of an electron beam source array via one or more coarse alignment processes;
determining fine adjustment data based on the scanned electric current; and
providing the fine adjustment data to adjust one or more positioners coupled to an electron beam source of the electron beam source array via one or more fine alignment processes,
wherein at least one of the electron-optical column array or the electron beam source array is a component of a scanning electron microscopy (SEM) system.

27. A method, comprising:
dismounting an electron beam source array from an electron-optical column array, wherein the electron beam source array includes a plurality of electron beam sources, wherein the plurality of electron beam sources generates a plurality of electron beams;
aligning a first electron beam source of the plurality of electron beam sources with a viewport of a test chamber, wherein the first electron beam source generates a first electron beam of the plurality of electron beams;
performing one or more inspection processes on the first electron beam of the plurality of electron beams;

repositioning the first electron beam source within the electron beam source array;

aligning at least an additional electron beam source of the electron beam source array with the viewport of the test chamber, wherein the at least the additional electron beam source generates at least an additional electron beam of the plurality of electron beams;

performing one or more inspection processes on the at least the additional electron beam of the plurality of electron beams;

repositioning the at least the additional electron beam source within the electron beam source array; and remounting the electron beam source array onto the electron-optical column array, wherein at least one of the electron beam source array, the electron-optical column array, or the test chamber is a component of a scanning electron microscopy (SEM) system.

28. The method in claim 27, wherein the one or more inspection processes performed on at least one of the first electron beam or the at least the additional electron beam includes:

at least one of one or more optical inspection processes, one or more pyrometry processes, or one or more vibrometry processes.

29. The method in claim 27, further comprising:

adjusting at least some of the plurality of electron beams based on data obtained via at least one of the one or more inspection processes performed on the first electron beam or the one or more inspection processes performed on the at least the additional electron beam.

30. The method in claim 27, further comprising:

aligning the plurality of electron beams generated by the plurality of electron beam sources of the electron beam source array with a plurality of electron-optical columns of the electron-optical column array.

31. The method in claim 30, wherein the aligning the plurality of electron beams generated by the plurality of electron beam sources of the electron beam source array with the plurality of electron-optical columns of the electron-optical column array further comprises:

scanning an area surrounding a bore of an electron-optical element of an electron-optical column of the plurality of electron-optical columns for an electric current generated by an electron beam of the plurality of electron beams directed at the bore.

32. The method in claim 31, wherein the aligning the plurality of electron beams generated by the plurality of electron beam sources of the electron beam source array with the plurality of electron-optical columns of the electron-optical column array further comprises:

determining coarse adjustment data based on the scanned electric current.

33. The method in claim 32, wherein the aligning the plurality of electron beams generated by the plurality of electron beam sources of the electron beam source array with the plurality of electron-optical columns of the electron-optical column array further comprises:

providing the coarse adjustment data to adjust a source tower of the electron beam source array via one or more coarse alignment processes.

34. The method in claim 33, wherein the aligning the plurality of electron beams generated by the plurality of electron beam sources of the electron beam source array with the plurality of electron-optical columns of the electron-optical column array further comprises:

determining fine adjustment data based on the scanned electric current.

35. The method in claim 34, wherein the aligning the plurality of electron beams generated by the plurality of electron beam sources of the electron beam source array with the plurality of electron-optical columns of the electron-optical column array further comprises:

providing the fine adjustment data to adjust one or more positioners coupled to an electron beam source of the plurality of electron beam sources of the electron beam source array via one or more fine alignment processes.

* * * * *